(12) United States Patent
Kobayashi et al.

(10) Patent No.: US 11,101,448 B2
(45) Date of Patent: Aug. 24, 2021

(54) ELECTRONIC DEVICE HAVING FUNCTIONAL LAYER INCLUDING PARTICLES AND BINDER MATERIAL

(71) Applicant: KONICA MINOLTA, INC., Tokyo (JP)

(72) Inventors: Yasunobu Kobayashi, Hachioji (JP); Takeshi Hakii, Sagamihara (JP); Shun Furukawa, Sagamihara (JP)

(73) Assignee: MERCK PATENTS GMBH, Darmstadt (DE)

( * ) Notice: Subject to any disclaimer, the term of this patent is extended or adjusted under 35 U.S.C. 154(b) by 98 days.

(21) Appl. No.: 16/348,387

(22) PCT Filed: Sep. 26, 2017

(86) PCT No.: PCT/JP2017/034804
§ 371 (c)(1),
(2) Date: May 8, 2019

(87) PCT Pub. No.: WO2018/088048
PCT Pub. Date: May 17, 2018

(65) Prior Publication Data
US 2020/0067023 A1    Feb. 27, 2020

(30) Foreign Application Priority Data
Nov. 8, 2016    (JP) .............................. JP2016-218327

(51) Int. Cl.
*H01L 51/50*    (2006.01)
*H01L 51/40*    (2006.01)
(Continued)

(52) U.S. Cl.
CPC .......... *H01L 51/5268* (2013.01); *C08G 61/10* (2013.01); *C08G 61/126* (2013.01);
(Continued)

(58) Field of Classification Search
CPC ............ H01L 51/5268; H01L 51/0035; H01L 51/0036; H01L 51/0043; H01L 51/44;
(Continued)

(56) References Cited

U.S. PATENT DOCUMENTS

2009/0051278 A1    2/2009    Saneto
2015/0287927 A1*   10/2015    Okubo .................. H01L 51/004
                                                                          257/40
2018/0175315 A1*    6/2018    Kon ....................... H05B 33/02

FOREIGN PATENT DOCUMENTS

JP         2004109497 A     4/2004
JP         2006193705 A     7/2006
(Continued)

OTHER PUBLICATIONS

KIPO, Office Action for the corresponding Korean patent application No. 2019-086624743, dated Nov. 29, 2019, with English translation (12 pages).

(Continued)

*Primary Examiner* — Alonzo Chambliss
(74) *Attorney, Agent, or Firm* — Lucas & Mercanti, LLP

(57) ABSTRACT

Provided are an electronic device and an organic electroluminescence element both of which are excellent in optical properties as well as long-term storage stability and scratch resistance. Herein, the electronic device includes at least one functional layer on a resin substrate, and the electronic device is configured so that the functional layer contains a component with a structure of X—Y—X' as a resin component; X and X' independently include at least any one of the formulae (1)~(7) respectively; and Y is a bivalent group including at least one S atom and one aromatic ring.

9 Claims, 2 Drawing Sheets

FIG. 1

(51) Int. Cl.

| | |
|---|---|
| *H01L 51/52* | (2006.01) |
| *C08G 61/10* | (2006.01) |
| *C08G 61/12* | (2006.01) |
| *C09D 5/33* | (2006.01) |
| *C09D 165/00* | (2006.01) |
| *H01L 51/00* | (2006.01) |
| *H01L 51/44* | (2006.01) |
| *H01L 27/32* | (2006.01) |
| *G02B 5/02* | (2006.01) |

(52) U.S. Cl.
CPC ............ *C09D 5/004* (2013.01); *C09D 165/00* (2013.01); *H01L 27/32* (2013.01); *H01L 51/0035* (2013.01); *H01L 51/0036* (2013.01); *H01L 51/0043* (2013.01); *H01L 51/44* (2013.01); *H01L 51/5012* (2013.01); *C08G 2261/124* (2013.01); *C08G 2261/18* (2013.01); *C08G 2261/228* (2013.01); *C08G 2261/312* (2013.01); *C08G 2261/3223* (2013.01); *C08G 2261/91* (2013.01); *C08G 2261/95* (2013.01); *G02B 5/0242* (2013.01); *G02B 5/0278* (2013.01); *H01L 51/0059* (2013.01); *H01L 51/0067* (2013.01); *H01L 51/0072* (2013.01); *H01L 51/0073* (2013.01); *H01L 51/0085* (2013.01); *H01L 2251/558* (2013.01)

(58) Field of Classification Search
CPC ..... H01L 51/5012; H01L 51/50; H01L 27/32; C08G 61/10; C08G 61/126; C09D 5/004; C09D 165/00
See application file for complete search history.

(56) References Cited

FOREIGN PATENT DOCUMENTS

| | | |
|---|---|---|
| JP | 2008221592 A | 9/2008 |
| JP | 2009070814 A | 4/2009 |
| JP | 2015109202 A | 6/2015 |
| JP | 2015156306 A | 8/2015 |
| JP | 2016039135 A | 3/2016 |
| KR | 20090019753 A | 2/2009 |

OTHER PUBLICATIONS

International Search Report dated Dec. 19, 2017 for PCT/JP2017/034804 and English translation.

* cited by examiner (A)  (B)  (C)  (D)

ELECTRONIC DEVICE HAVING FUNCTIONAL LAYER INCLUDING PARTICLES AND BINDER MATERIAL

CROSS REFERENCE TO RELATED APPLICATION

This Application is a 371 of PCT/JP2017/034804 filed on Sep. 26, 2017 which, in turn, claimed the priority of Japanese Patent Application No. 2016-218327 filed on Nov. 8, 2016, both applications are incorporated herein by reference.

FIELD OF INVENTION

The present invention relates to an electronic device and an organic electroluminescence element.

BACKGROUND ART

A transparent conductive member having a conductive layer which is formed on a resin film or a glass plate using a conductive substance has been widely used as a transparent electrode of a thin type electronic device such as an organic electroluminescence (OEL) element applied to a display and a lighting panel, a solar cell and electronic paper or the like.

For example, Patent Document 1 discloses a flexible substrate formed by stacking resin layers having a light scattering function on at least one side of a glass plate.

DOCUMENTS OF PRIOR ART

Patent Documents

Patent Document 1: Japanese Unexamined Patent Application Publication No. 2016-39135

SUMMARY OF INVENTION

Problems to be Solved by Invention

However, as for a resin layer disclosed in Patent Document 1, a specifically disclosed resin has a low refractive index and light scattering ability. Further, gaps formed on a surface of a resin layer as well as outgas thus generated deteriorate the resin layer and harmfully influence adjacent layers. Therefore, an electronic device using a flexible substrate of Patent Document 1 has a problem of decrease in long-term storage stability.

Moreover, a resin with a high refractive index is necessary to provide an electronic device with high efficiency and high increased area. However, an electronic device having a resin layer using a resin with a high refractive index has a problem of long-term storage stability due to properties of raw materials used for the device. Furthermore, when a conventional flexible substrate, etc. is arranged outside an electronic device, such an arrangement causes problems: the substrate tends to wear out to be easily damaged and scratch resistance thereof is low.

In view of the above problems, an object of the present invention is to provide an electronic device and an organic electroluminescence element both of which are excellent in optical properties as well as long-term storage stability and scratch resistance.

Means for Solving Problems

The object of the present invention is achieved by the following aspects.

1. An electronic device having at least one functional layer on a resin substrate, where the functional layer contains a component with a structure of X—Y—X' as a resin component; X and X' are independently have one of structures represented by the following formulae (1)~(7), respectively; and Y is a bivalent group having at least one S atom and one aromatic ring.

2. An electronic device described in aspect 1, where Y has one of structures represented by —R—R'—, —R—S—R'—, and —R—S(O)—R'—; and R and R' independently have structures represented by the following formulae (8)~(12), respectively.

Note, when Y is —R—R'—, at least one of R and R' is represented by the following formula (12).

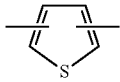
(12)

3. An organic electroluminescence element, where the electronic device described in aspect 1 or 2 is an organic electroluminescence element.

4. An organic electroluminescence element described in aspect 3, where an optical scattering layer is a layer containing particles and a binder in the functional layer.

5. An organic electroluminescence element described in aspect 4, where the optical scattering layer contains spherical particles as the particles with an aspect rate of 2 or less and a rate of a number of particles in 80% or more.

6. An organic electroluminescence element described in aspect 4 or 5, where the optical scattering layer has a thickness larger than a mean particle diameter of the particles; and a particle presence volume rate of the particles present in a region located at a side of the resin substrate relative to a center in a thickness direction of the optical scattering layer is larger than that of the particles present in a region located at a side of a transparent conductive film formed on the optical scattering layer relative to the center in the thickness direction.

7. An organic electroluminescence element described in any one of aspects 4~6, where the particles in the optical scattering layer have a volume rate in the range from 1 volume % to 40 volume %.

8. An organic electroluminescence element described in any one of aspects 4~7, where a difference in refractive indexes between the particle and the binder is in the range from 0.20 to 1.00.

9. An organic electroluminescence element described in any one of aspects 5~8, where the spherical particles have a mean particle diameter in the range from 200 nm to 500 nm.

10. An organic electroluminescence element described in any one of aspects 4~9, where the optical scattering layer has a thickness in the range from 250 nm to 1000 nm.

Effect of Invention

According to the present invention, it is possible to provide an electronic device and an organic electroluminescence element both of which are excellent in optical properties as well as long-term storage stability and scratch resistance.

EMBODIMENTS FOR CARRYING OUT INVENTION

Hereinafter, embodiments of the present invention will be described in detail. However, the present invention is not limited to those embodiments. Note, a mark of "~" is used indicating that the numerical values described across the mark are included as a lower limit value and an upper limit value.

<<Electronic Device>>

An electronic device has at least one functional layer on a resin substrate. Hereinafter, an organic electroluminescence element (i.e., an organic EL element) will be described as an example of the electronic device.

An organic EL element includes at least a transparent conductive member provided with a resin substrate, a functional layer and a transparent conductive film.

First, a transparent conductive member will be described, and subsequently an organic EL element will be described.

<<Transparent Conductive Member>>

Figure 1:
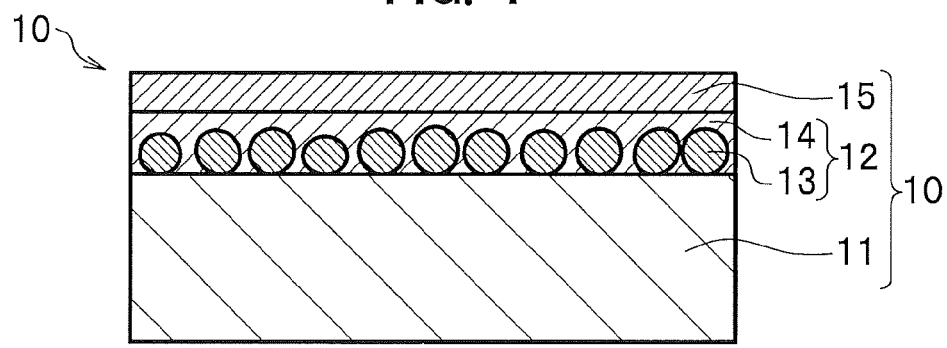
FIG. 1 is a schematic cross-sectional diagram of a transparent conductive member.

As shown in FIG. 1, a transparent conductive member 10 includes a resin substrate 11, an optical scattering layer 12 formed on the resin substrate 11, and a transparent conductive film 15 formed on the optical scattering layer 12.

Next, each of the components will be described in detail.

<<Resin Substrate>>

The resin substrate 11 is not specifically limited as long as it has high optical transparency. For example, a resin base and a resin film are preferably used therefor. From viewpoints of productivity and lightweight and flexible properties, preferably a transparent resin film may be used.

A resin used for the resin substrate 11 is not specifically limited. For example, included are a polyester based resin such as polyethylene terephthalate (PET), polyethylene naphthalate (PEN) and modified polyesters; a polyolefin based resin such as a polyethylene (PE) resin, a polypropylene (PP) resin, a polystyrene resin and a cyclic olefin based resin; a vinyl based resin such as polyvinyl chloride and polyvinylidene chloride; a polyether ether ketone (PEEK) resin; a polysulfone (PSF) resin; a polyether sulfone (PES) resin; a polycarbonate (PC) resin; a polyamide resin; a polyimide resin; an acrylic resin, and a triacetyl cellulose (TAC) resin or the like. Those resins may be used alone or a plurality of resins may be used in combination.

Further, the resin substrate 11 may be an unstretched film or a stretched film.

The resin substrate 11 with high transparency is preferable because the transparent conductive member 10 may be used as a transparent electrode of the electronic device. Herein, the high transparency is defined as a total light transmittance in a visible light wavelength range is 50% or more, and more preferably 80% or more, when measured by a method conformable to JIS K 7361-1: 1997 (i.e., a test method of a total light transmittance of a plastic-transparent material).

The resin substrate 11 may be subjected to surface activation treatment in order to improve adhesiveness to the optical scattering layer 12 formed on the resin substrate 11. Further, the resin substrate 11 may be provided with a hard coat layer in order to improve shock resistance thereof. Such surface activation treatment includes, for example, corona discharge treatment, flame treatment, ultraviolet treatment, high frequency treatment, glow discharge treatment, active plasma treatment, and laser treatment or the like.

A material of the hard coat layer includes, for example, polyester, polyamide, polyurethane, a vinyl based copolymer, a butadiene based copolymer, an acrylic copolymer, a vinylidene based copolymer and an epoxy based copolymer or the like. Among those materials, an ultraviolet curing type resin may be preferably used. Here, the optical scattering layer 12 may be a single layer. However, when the optical scattering layer 12 has a multilayer structure, adhesiveness thereof may be more improved.

<Functional Layer>

A functional layer of the present invention is a layer having a high refractive index, light scattering property and scratch resistance all of which are not included in other layers. For example, the functional layer is a layer having functions of a high refractive index layer, an optical scattering layer and a hard coat layer or the like.

<Optical Scattering Layer>

The optical scattering layer 12 is a functional layer which improves light-extraction efficiency, and includes particles 13 and a binder 14.

The binder 14 contains a component having a structure of X—Y—X' as a resin component. Here, at least X and X' independently have one of the following formulae (1)~(7), respectively.

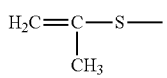  (1)

  (2)

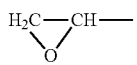  (3)

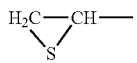  (4)

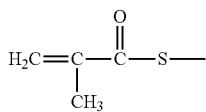  (5)

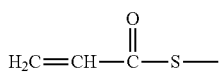  (6)

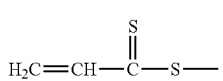  (7)

Further, Y is a bivalent group having at least one S atom and one aromatic ring.

More specifically, for example, Y has one of structures represented by —R—R'—, —R—S—R'—, and —R—S(O)—R'—. Herein, R and R' independently have one of structures represented by the following formulae (8)~(12), respectively.

Note, when Y has a structure of —R—R'—, at least one of R and R' has a structure represented by the following formula (12).

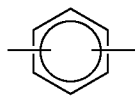  (8)

  (9)

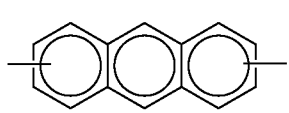  (10)

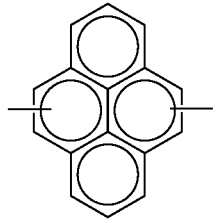  (11)

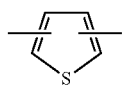  (12)

In the present embodiment, having a component with a structure of X—Y—X'— in the binder 14 as a resin component is designed to realize a high refractive index and scratch resistance of the resin itself, and to suppress harmful effects on an organic layer when the organic layer is deposited inside the element.

Here, preferably a rate of a number of S atoms included in Y of the structure of X—Y—X' is in the range from 2% to 30% per a number of C atoms included in Y.

When the rate of the number of S atoms included in Y is 2% or more per the number of C atoms included in Y, a refractive index is further improved. More preferably, the rate is 5% or more. Further, when the rate of the number of S atoms included in Y is 30% or less per the number of C atoms included in Y, a degree of yellowing is reduced. More preferably, the rate is 25% or less.

Moreover, preferably a rate of the number of C atoms in the aromatic ring included in Y of the structure of X—Y—X' is in the range from 50% to 80% per a number of other elements in the aromatic ring included in Y.

When the rate of the number of C atoms in the aromatic ring included in Y is 50% or more per the number of other elements in the aromatic ring included in Y, the refractive index is more improved. More preferably, the rate is 55% or more. On the contrary, when the rate of the number of C atoms in the aromatic ring included in Y is 80% or less per the number of other elements in the aromatic ring included in Y, stability of the materials is more improved. More preferably, the rate is 70% or less.

Note, a shortage of a refractive index rather than the index desired for the resin itself may be compensated by adding nanoparticles with a high refractive index.

A combination example of X—Y—X' includes combinations listed in Table 1. Further, other combinations unlisted in Table 1 may be preferably used in the present invention if those combinations satisfy the aforementioned conditions. Herein, numerals in the columns of X and X' and numerals (e.g., (1)) in the column of Y described in Table 1 correspond to the compounds represented by the formulae (1)~(12) described in the present specification.

TABLE 1

| | Resin Construction | | |
|---|---|---|---|
| Example | X | Y | X' |
| 1 | (1) | -(8)-(12)-(8)- | (1) |
| 2 | (1) | -(8)-(12)-(8)- | (2) |
| 3 | (1) | -(8)-(12)-(8)- | (3) |
| 4 | (1) | -(8)-(12)-(8)- | (4) |
| 5 | (1) | -(8)-(12)-(8)- | (5) |

TABLE 1-continued

| | Resin Construction | | |
|---|---|---|---|
| Example | X | Y | X' |
| 6 | (1) | -(8)-(12)-(8)- | (6) |
| 7 | (1) | -(8)-(12)-(8)- | (7) |
| 8 | (2) | -(8)-(12)-(8)- | (2) |
| 9 | (2) | -(8)-S-(8)- | (2) |
| 10 | (2) | -(8)-S(O)-(8)- | (2) |
| 11 | (2) | -(8)-S(O)2-(8)- | (2) |
| 12 | (2) | -(8)-S-(9)- | (2) |
| 13 | (2) | -(8)-S-(10)- | (2) |
| 14 | (2) | -(8)-S-(11)- | (2) |
| 15 | (2) | -(8)-S-(12)- | (2) |
| 16 | (1) | -(8)-S-(8)- | (1) |
| 18 | (2) | -(8)-S-(9)- | (2) |
| 19 | (3) | -(8)-S-(10)- | (3) |
| 20 | (4) | -(8)-S-(11)- | (4) |
| 21 | (5) | -(8)-S-(12)- | (5) |

In the transparent conductive member 10, it is preferable that particles 13 included in the optical scattering layer 12 include spherical particles at a rate of a number of particles in 80% or more with an aspect rate of 2 or less. Further, preferably the optical scattering layer 12 has a thickness larger than a mean particle diameter of the particles 13. Note, the mean particle diameter described herein means a mean particle diameter of all the particles 13. As described above, when particles 13 include spherical particles at a rate of a number of particles in 80% or more with an aspect rate of 2 or less and the optical scattering layer 12 has a thickness larger than the mean particle diameter of the particles 13, the particles 13 tend to be unevenly distributed in a region of the optical scattering layer 12 at a side of the resin substrate 11.

Herein, a method for unevenly distributing particles 13 in a region at a side of the resin substrate 11 may be carried out, for example, by the steps of diluting particles 13 in a liquid down to a concentration lower than that typically used in coating, and applying the particles 13 in the liquid thicker than usual to compensate for the dilution of the liquid. This method allows a control of a time from just after application to an end of drying the applied film, and easy sedimentation of the particles 13 at a side of the resin substrate 11. Therefore, it is possible to control a particle presence volume rate of the particles 13 at a side of the resin substrate 11.

Alternatively, the particles 13 may be unevenly distributed by repeatedly applying a liquid with a modified concentration of the particles 13 to form a stack of layers, or applying a first liquid that contains the particles 13 and subsequently applying a second liquid that contains only a resin without the particles 13 on a coating of the first liquid.

Note, uneven distribution of the particles 13 is defined as a state in which a volume rate of the particles 13 at a side of the transparent conductive film 15 is different from that at a side of the resin substrate 11 in the optical scattering layer 12 when the optical scattering layer 12 is divided to two sides at a center of a resin construction part alone in a thickness direction thereof.

Herein, preferably in the optical scattering layer 12, a particle presence volume rate of the particles 13 in a region at a side of the resin substrate 11 relative to a center in the thickness direction is larger than that of the particles 13 in a region at a side of the transparent conductive film 15 relative to a center in the thickness direction.

Here, a particle presence volume rate is a rate of a volume of the particles 13 present at a specific side of the optical scattering layer 12 per a volume of all the particles 13 included in the optical scattering layer 12. That is, for example, a particle presence volume rate of the particles 13 in a region at a side of the resin substrate 11 relative to a center in the thickness direction means a rate of a volume of the particles 13 in a region at a side of the resin substrate 11 relative to a center in the thickness direction per a volume of all the particles 13 included in the optical scattering layer 12.

A method for calculating a particle presence volume rate at a side of the resin substrate 11 is conducted by the steps of preparing a cross-section of the optical scattering layer 12, optionally selecting five locations respectively from a region at a side of the resin substrate 11 and a region at a side of the transparent conductive film 15 relative to a center in the thickness direction, taking pictures of the selected five locations by a transmission electronic microscope (TEM), and calculating an area of a resin component part and an area of the particles 13 based on a thickness of the optical scattering layer 12 and a cross-sectional area of the particle 13.

In the present invention, a rate of the particles 13 present at a side of the resin substrate 11 thus calculated as mentioned above is defined as a particle presence volume rate.

Preferably, a particle presence volume rate at a side of the resin substrate 11 in the optical scattering layer 12 is more than 50%. More preferably, the particle presence volume rate at a side of the resin substrate 11 in the optical scattering layer 12 is 60% or more, further more preferably 65% or more.

As described above and shown in FIG. 1, uneven distribution of spherical particles 13 in a region at a side of the resin substrate 12 is easy to construct the optical scattering layer 12 such that the particles 13 do not intrude into a portion (i.e., of the transparent conductive film 15) above a surface of the binder 14 at a side of the transparent conductive film 15 in the optical scattering layer 12. As a result, it is possible to prevent generation of roughness on a surface of the optical scattering layer 12 possibly caused by intrusion of the particles 13, thereby increasing flatness of the surface of the optical scattering layer 12. The increase in flatness of the surface of the optical scattering layer 12 improves deposition performance of organic layers. Preferably, the optical scattering layer 12 has smaller arithmetic mean roughness Ra (JIS B 0601: 2001) in the surface roughness. Preferably, the surface roughness is 10 nm or less in terms of the arithmetic mean roughness, more preferably 5 nm or less in terms of the arithmetic mean roughness. Note, the arithmetic mean roughness Ra is measured by, for example, an atomic force microscope (Digital Instruments).

Further, a light scattering amount increases as a particle presence volume rate at a side of the resin substrate 11 increases in the optical scattering layer 12. This increase in the light scattering amount facilitates improvement of light extraction efficiency.

Moreover, preferably a volume rate between the above described particles 13 and resin (hereinafter, referring to as a "PB rate") is in the range from 1 volume % to 40 volume %. Herein, the volume rate (PB rate) is a rate between a volume of particles and a total volume of particles and binder [i.e., volume of particles/(volume of particles+volume of binder)×100] in all the volume of the optical scattering layer 12.

Setting the PB rate to 1 volume % or more easily improves light scattering efficiency and light extraction efficiency in the optical scattering layer 12. Preferably, the PB rate is 5 volume % or more, more preferably 10 volume % or more, and further more preferably 15 volume % or more. In contrast, the PB rate of 40 volume % or less easily increases a particle presence volume rate at a side of the resin substrate 11 and easily prevents intrusion of the particles 13 from a surface of the optical scattering layer 12 possibly caused by an excessive addition of the particles 13. This feature easily improves flatness of a surface of the optical scattering layer 12. Therefore, preferably the PB rate is 40 volume % or less, more preferably 30 volume % or less.

Next, refractive indexes of a binder and a particle will be described more specifically. Hereinafter, refractive indexes of the binder and the particle are measurements at a light wavelength of 633 nm.

Preferably, the binder 14 has a refractive index "nb" of 1.50 or more and less than 2.00 at a light wavelength of 633 nm. Herein, the refractive index "nb" of the binder 14 is a refractive index of a single material alone when the binder 14 is formed by the single material alone. On the contrary, when the binder 14 is formed of mixed materials, a refractive index thereof is a refractive index thus calculated by a sum of values each obtained by multiplying a refractive index inherent in each material by a mixing rate of each material.

Further, a role of the particles 13 in the optical scattering layer 12 includes a function of scattering guided wave light. Improving a function of scattering guided wave light needs to improve scattering performance of the particles 13. Here, various methods may be suggested in order to improve the scattering performance, for example, by the steps of increasing a difference in refractive indexes between the particle 13 and binder 14, increasing a thickness of the layer, and increasing density of particles or the like. Among those, a method affording the smallest harmful effect on other performance is the step of increasing a difference in refractive indexes between the particle 13 and binder 14.

Preferably, a difference in refractive indexes |nb−np| between the refractive index "nb" of binder 14 and the refractive index "np" of particle 13 thus included is in the range from 0.20 to 1.00, and more preferably 0.30 or more. When a difference in refractive indexes |nb−np| between the binder 14 and particle 13 is 0.20 or more, a scattering effect is exerted at an interface between the binder 14 and particle 13. The more the difference in refractive indexes |nb−np| increases, the more the refraction increases, leading to increase in the scattering effect. On the contrary, when a difference in refractive indexes |nb−np| is 1.00 or less, this feature suppresses irregular reflection, leading to suppression of a drop in the efficiency.

Generating a difference in refractive indexes |nb−np| needs to make the refractive index "np" of the particle 13 smaller than the refractive index "nb" of the binder 14, or make the refractive index "np" of the particle 13 larger than the refractive index "nb" of the binder 14. Herein, when the particle 13 is formed of a single material, the refractive index np of the particle 13 is a refractive index of the single material. By contrast, when the particle 13 is formed of mixed materials, the refractive index "np" of the particle 13 is a refractive index thus calculated by a sum of values each obtained by multiplying a refractive index inherent in each material by a mixing rate of each material.

When the refractive index "np" of the particle 13 is smaller than the refractive index "nb" of the binder 14, it is preferable to use a particle with a low refractive index "np" of less than 1.50 as the particle 13. Further, it is preferable to use a binder with a high refractive index "nb" of 1.60 or more as the binder 14.

By contrast, when the refractive index np of the particle 13 is larger than the refractive index "nb" of the binder 14, it is preferable to use a particle with a high refractive index "np" in the range from 1.70 to 3.00 as the particle 13. Further, it is preferable to use a binder as the binder 14 with a low refractive index "nb" smaller than the refractive index np of particle 13 by 0.20 or more.

As described above, the optical scattering layer 12 has an effect for scattering light by a difference in refractive indexes between the binder 14 and particle 13. Therefore, the particle 13 is desired to have a less harmful effect on other layers and high performance of scattering light.

A layer thickness of optical scattering layer 12 is needed large at a certain degree to secure an optical path for causing scattering, while the layer thickness is needed small at a certain degree not to cause an energy loss by absorption of light. Thus, preferably the optical scattering layer 12 has a thickness in the range from 250 nm to 1000 nm, more preferably 300 nm or more, and further more preferably 800 nm or less.

Note, preferably the optical scattering layer 12 working as a single layer has a haze value of 20% or more, more preferably 25% or more, and further more preferably 30% or more. A haze value of 20% or more enables improvement of a light scattering property (i.e., light extraction efficiency).

Next, aspects other than the above described ones of the particle and binder will be described more specifically.

[Particle]

As mentioned above, preferably the optical scattering layer 12 includes as the particles 13 spherical particles with an aspect rate of 2 or less and a rate of a number of particles in 80% or more. Such spherical particles with an aspect rate of 2 or less have preferably a mean particle diameter in the range from 200 nm to 500 nm, more preferably 230 nm or more, further more preferably 250 nm or more. Moreover, preferably the mean particle diameter is 450 nm or less, and further more preferably less than 400 nm.

Herein, an aspect rate as mentioned above is a rate between a long axis length and a short axis length of the particle 13 [i.e., long axis length/short axis length]. For example, the aspect rate can be calculated by taking images of the particle 13 via randomly taking pictures thereof using a scanning electroscopic microscope (SEM), and measuring a long axis length and a short axis length of the particle 13 based on the images.

For example, the aspect rate is calculated by taking pictures of the particles by magnification of 100000, and checking the aspect rates of 100 particles thereby to provide the rate.

As to the optical scattering layer 12, for example, it is possible to improve the scattering performance by adjusting a mean particle diameter and an aspect rate of the particle 13. More specifically, it is preferable to use particles in the range of causing Mie scattering or more in a visible light region. In contrast, unevenly distributing the particles 13 at a side of the resin substrate 11 so as to flatten a surface of the optical scattering layer 12 is required to make the mean particle diameter smaller than a thickness of the optical scattering layer 12.

The mean particle diameter of the particle 13 may be measured by processing images of electronic microscopic photographs. For example, the measurement is conducted by taking an image of the particle 13 by a magnification of 100000, measuring a length of the long side of the particle 13 based on the image, and averaging the resulting lengths of 100 particles. This averaged value is defined as a mean particle diameter of the particles 13

The particle 13 is not specifically limited, and preferably selected from either of the above described particle with a low refractive index or the above described particle with a high refractive index depending on a purpose. For example, an organic microparticle and an inorganic microparticle may be used as a particle with a low refractive index and a particle of a high refractive index.

When the light scattering layer 12 has a construction where the refractive index "np" of the particle 13 is smaller than the refractive index "nb" of the binder 14, such a particle with a low refractive index includes a particle made of, for example, an acrylic resin (1.49), PTFE (1.35), PFA (1.35), $SiO_2$ (1.46), magnesium fluoride (1.38), lithium fluoride (1.392), potassium fluoride (1.399), silicon rubber (1.40), vinylidene fluoride (1.42), silicone resin (1.43), polypropylene (1.48) and urethane (1.49) or the like. Herein, each value in the parentheses shows a representative refractive index made of the respective materials.

In contrast, when the light scattering layer 12 has a construction where the refractive index "np" of the particle 13 is larger than the refractive index "nb" of the binder 14, quantum dots described in WO2009/014707 and U.S. Pat. No. 6,608,439 may be preferably used as a particle having a high refractive index. However, among those, preferably the quantum dot is an inorganic microparticle having a high refractive index.

Further, an organic microparticle having a high refractive index includes, for example, a polymethyl methacrylate bead, an acryl-styrene copolymer bead, a melamine bead, a polycarbonate bead, a styrene bead, a crosslinked polystyrene bead, a polyvinyl chloride bead, and a benzoguanamine-melamine formaldehyde bead or the like.

Moreover, an inorganic microparticle having a high refractive index includes, for example, an inorganic oxide microparticle made of at least one oxide of metal selected from zirconium, titanium, aluminum, indium, zinc, and antimony. More specifically, such an inorganic oxide microparticle includes a microparticle made of, for example, $ZrO_2$, $TiO_2$, $BaTiO_3$, $Al_2O_3$, $In_2O_3$, ZnO, $SnO_2$, $Sb_2O_3$, ITO (i.e., indium-tin oxide), $SiO_2$, $ZrSiO_4$, zeolite or the like. Among those oxides, preferable ones are $TiO_2$, $BaTiO_3$, $ZrO_2$, ZnO and $SnO_2$, and the most preferable one is $TiO_2$.

Furthermore, among different types of $TiO_2$, a rutile type $TiO_2$ is more preferable than an anatase type $TiO_2$ because a low catalytic activity thereof increases weather resistance of the optical scattering layer 12 and layers adjacent thereto, and further because of the higher refractive index thereof.

Here, it is possible to select whether or not the particle 13 is subjected to surface treatment, in view of improving a dispersive property and stability when the particle 13 is used in a dispersion liquid and to be included in the optical scattering layer 12 as mentioned hereinafter.

When the particle 13 is subjected to surface treatment, specific exemplary materials used for the surface treatment include, for example, dissimilar inorganic oxides such as silicon oxide and zirconium oxide; metal hydroxides such as aluminum hydroxide; and organic acids such as organosiloxane and stearic acid. Herein, those surface treatment materials may be used alone as a single material or in combination with multiple materials.

However, in view of stabilizing the dispersion liquid, preferably a material of the surface treatment is selected from at least one of dissimilar inorganic oxides and metal hydroxides, more preferably selected from metal hydroxides. Note, when the particle 13 is subjected to the surface treatment, a portion subjected to the surface treatment of the particle is also included in a particle volume.

When the inorganic oxide particles are subjected to surface coating treatment using a material for the surface treatment, a coating amount of (i.e., generally, a coating amount is represented by a rate between a mass of the surface treatment material used for a surface of the particle and a mass of the particle itself) is preferably in the range from 0.01 mass % to 99 mass %. Setting the rate in the above range allows realization of sufficient improvement effects of dispersibility and stability caused by the surface treatment.

[Binder]

The binder 14 contains as a resin component a component having a structure of X—Y—X' as described hereinbefore. The resin component may be a component of only a component having a structure of X—Y—X', or may include other resin components to be described later.

A known binder may be used for such other components without any specific limitation. Further, multiple types of binders may be mixed and used for other resin components.

Here, when the binder 14 is made of a mixed material between a resin component having a structure of X—Y—X' and other resin components, as mentioned before, it is preferable to set a difference in refractive indexes |nb−np| between a refractive index "nb" of the binder 14 and a refractive index "np" of the particle 13 in the range from 0.20 to 1.00. Further, when the refractive index "np" of the particle 13 is smaller than the refractive index "nb" of the binder 14, it is preferable to use a binder with a high refractive index as other resin components.

Here, it is preferable to use a binder made by mixing a resin component with a structure of X—Y—X' and other resin component so that the refractive index "nb" of the binder 14 is 1.60 or more, with respect to a binder having a high refractive index to be used in the optical scattering layer 12. Herein, the refractive index "np" of the particle 13 is smaller than the refractive index "nb" of the binder 14.

Such a binder with a high refractive index includes, for example, Lioduras™ TYZ series, Lioduras™ TYT series (TOYO INK SC HOLDINGS CO., LTD); $ZrO_2$ microparticle-containing resin coating (Pixelligent Technologies); UR series (Nissan Chemical Corporation); ORGATIX™ series (Matsumoto Fine Chemical Co., Ltd.); PIUVO series (KSM CO., LTD.); acrylic resin series, epoxy resin series (NTT Advanced technology Corporation); and HITALOID™ (Hitachi Chemical Co., Ltd.) or the like.

Further, when the refractive index "np" of the particle 13 is larger than the refractive index "nb" of the binder 14 in the optical scattering layer 12, it is preferable to use a binder having a refractive index so that the refractive index "nb" of the binder made by mixing a resin component with a structure of X—Y—X' and other resin component is smaller than the refractive index "np" of the particle 13 by 0.20 or more, and simultaneously of which refractive index is made as higher as possible. Herein, the binders described hereinbefore each having a high refractive index may be used for the said binder with a high refractive index.

A reason for taking the above construction is that light coming from a side of the optical scattering layer 12 cannot enter inside the binder depending on an incident angle thereby to be reflected, when the binder 14 is made of a binder with a low refractive index thus made by mixing a resin component with a structure of X—Y—X' and other resin component.

Moreover, a compound that produces an oxide, a nitride or an oxidized nitride of an inorganic material or metal when the compound is irradiated with ultraviolet light rays under a specific atmosphere is especially preferably used as a binder of other resin component in the optical scattering layer 12. Preferably, a compound capable of being subjected to reforming treatment at a relatively low temperature thus described in JPH8-112879 is suitable for the compound as mentioned above.

Specifically, the said compound includes, for example, polysiloxane having a Si—O—Si bond (i.e., including polysilsesquioxane), polysilazane having a Si—N—Si bond, and polysiloxazane having both the Si—O—Si bond and Si—N—Si bond or the like. Herein, the above materials may be used by mixing 2 or more materials.

(Polysiloxane)

A polysiloxane used in the optical scattering layer 12 may include $R_3SiO_{1/2}$, $R_2SiO$, $RSiO_{3/2}$ and $SiO_2$ as a general structural unit. Herein, R(s) are independently selected from the group of a hydrogen atom; an alkyl group including 1~20 carbon atoms such as methyl, ethyl and propyl; an aryl group such as phenyl; and an unsaturated alkyl group such as vinyl or the like.

Examples of a specific polysiloxane group include $PhSiO_{3/2}$, $MeSiO_{3/2}$, $HSiO_{3/2}$, $MePhSiO$, $Ph_2SiO$, $Ph"Vi"SiO$, $"Vi"SiO_{3/2}$, $MeHSiO$, $Me"Vi"SiO$, $Me_2SiO$ and $Me_3SiO_{1/2}$ or the like. Further, a mixture and a copolymer of polysiloxanes may be used. Herein, the term of "Vi" represents a vinyl group.

(Polysilsesquioxane)

In the optical scattering layer 12, it is preferable to use a polysilsesquioxane among the polysiloxanes described above. A polysilsesquioxane is a compound including a silsesquioxane in a structural unit. A "silsesquioxane" is a compound represented by $RSiO_{3/2}$, generally represented by $RSiX_3$ (here, R is a hydrogen atom, an alkyl group, an alkenyl group, an aryl group, and an araalkyl group (or called an aralkyl group); and X is a halogen atom and alkoxy group or the like.

A representative form of molecular arrangement of the polysilsesquioxane is known as a formless structure, a ladder structure, a cage structure, and other partially cleavage structure (i.e., a structure in which one silicon atom is lacked from the cage structure, or a structure in which a part of silicon-oxygen bonds is cleaved in the cage structure) or the like.

Here, it is preferable to use a so-called hydrogen silsesquioxane polymer among those polysilsesquioxanes. Such a hydrogen silsesquioxane polymer includes a hydride siloxane polymer represented by $HSi(OH)_x(OR)_yO_{z/2}$. Each of R(s) is an organic group or a substituted organic group, and forms a hydrolyzed substituent group when R is bonded to a silicon atom via an oxygen atom. Herein, x=0~2, y=0~2, z=1~3 and x+y+z=3. R includes an alkyl group (e.g., methyl, ethyl, propyl and butyl, etc.), an aryl group (e.g., phenyl), an alkenyl group (e.g., allyl and vinyl, etc.). Those polymeric resins may be completely condensed like $(HSiO_{3/2})_n$, or partially hydrolyzed (i.e., including a part of Si—OR) or partially condensed (i.e., including a part of Si—OH) or may be the both.

(Polysilazane)

A polysilazane used in the optical scattering layer 12 is a polymer having a silicon-nitrogen bond, represented by an inorganic precursor polymer such as $SiO_2$, $Si_3N_4$ and an intermediate solid solution of the both like $SiO_xN_y$ (x=0.1~1.9, Y=0.1~1.3) thus formed of Si—N, Si—H and N—H and so on.

A polysilazane represented by the following formula (20) may be used as a polysilazane preferably used for the optical scattering layer 12.

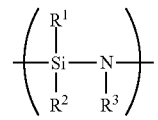

Formula (20)

In Formula (20), $R^1$, $R^2$ and $R^3$ independently represent a hydrogen atom, an alkyl group, an alkenyl group, a cycloalkyl group, an aryl group, an alkylsilyl group, an alkylamino group, or an alkoxy group.

Here, a perhydropolysilazane (PHPS) in which all of $R^1$, $R^2$ and $R^3$ in Formula (20) are a hydrogen atom is especially preferable in view of compactness as a film with respect to the optical scattering layer 12 to be obtained. The perhydropolysilazane is assumed to have a structure in which a straight chain structure and a cyclic structure mainly of a 6-membered ring and a 8-membered ring are present. A molecular weight thereof when represented by a number average molecular weight (Mn) is in the range from about 600 to about 2000 (i.e., it is polystyrene conversion by gel permeation chromatography). A perhydropolysilazane is a liquid or a solid substance.

A polysilazane is a commercially available product in a solution state dissolved in an organic solvent. Such a product may be used as it is for a polysilazane-containing coating liquid. The commercial product of a polysilazane solution includes, for example, NN120-20, NAX120-20 and NL120-20, etc. (AZ Electronic materials PLC.).

Further, an organic titanium compound may be added to the product as a binder of a resin component. Particularly preferable is a compound including $—OC_nH_{2n+1}$, $—OCH=CH_2$, and $—OCOCH=CH_2$. Addition of those compounds enables increase in a refractive index of the binder without harmfully influencing other properties. Preferably, an addition amount thereof is in the range from 1 mass % to 5 mass %, more preferably from 5 mass % to 30 mass %.

A resin composition curable via ionizing radiation may be used for a binder of other resin component. A method for curing the resin composition curable via ionizing radiation includes a typical curing method. That is, the composition may be cured by electron beam irradiation or ultraviolet irradiation.

For example, in case of electron beam curing, electron beams having energy of 10 keV~1000 keV, preferably 30 keV~300 keV radiated from various electron beam accelerators such as a Cockcroft-Walton type, a Van de Graaff type, a resonance transformer type, an insulated core transformer type, a linear type, a dynamitron type, and a high frequency type accelerators. Further, in case of ultraviolet curing, usable is ultraviolet light emitted from light sources such as an ultrahigh pressure mercury lamp, a high pressure mercury lamp, a low pressure mercury lamp, a carbon ark lamp, a xenon arc lamp, and a metal halide lamp.

(Vacuum Ultraviolet Irradiation Device with Excimer Lamp)

An ultraviolet irradiation device includes, for example, a rare gas excimer lamp that emits vacuum ultraviolet rays in the range from 100 nm to 230 nm.

Rare gas atoms such as xenon (Xe), krypton (Kr), argon (Ar) and neon (Ne) are called inert gases because those atoms do not form molecules by chemically combined each other. However, a rare gas atom which has obtained energy via electric discharge, etc. (i.e., excited atoms) may be combined with another atom to form a molecule.

For example, in case of rare gas xenon (Xe), when Xe$_2$* that is an excimer molecule thus excited causes transition to a ground state as shown by the following equation, the resulting transition emits excimer light of 172 nm.

$$e + Xe \rightarrow Xe^*$$

$$Xe^* + 2Xe \rightarrow Xe_2^* + Xe$$

$$Xe_2^* \rightarrow Xe + Xe + h\nu (172 \text{ nm})$$

An excimer lamp is characterized by the high efficiency because light thereof emits via concentrated on one wavelength, and light other than necessary light hardly emits. Further, a temperature of an irradiated object may be kept relatively low because no excessive light emits therefrom. Moreover, instant flashing on and off may be carried out because no time is needed for start and restart processes.

A light source for efficiently emitting excimer light includes a dielectric barrier discharge lamp.

Such a dielectric barrier discharge lamp has a structure causing electric discharge between electrodes through a dielectric substance. Generally, in the structure, at least one of electrodes is arranged in a discharge vessel made of a dielectric substance and at an outside of the vessel. An example of the dielectric barrier discharge lamp is a lamp in which rare gas like xenon is encapsulated in a double cylindrical discharge vessel formed of a thick pipe and a thin pipe made of quartz glass, a first electrode in a net-like shape is disposed outside the discharge vessel, and the other electrode is disposed inside an inner pipe.

The dielectric barrier discharge lamp generates dielectric barrier discharge inside the discharge vessel by applying a high frequency voltage between electrodes, and emits excimer light while excimer molecules like xenon generated by the discharge are dissociating.

The excimer lamp has high efficiency of light emission, allowing the lamp to be lit by input of low electric power. Further, the excimer lamp emits no light with a long wavelength which is attributed to temperature rising, but instead irradiates energy with a single wavelength in the ultraviolet region. This feature enables suppression in the temperature rising of the irradiated object caused by the irradiated light itself.

<Transparent Conductive Film>

A transparent conductive film 15 is disposed on a surface of the optical scattering layer 12. The transparent conductive film 15 is a layer containing a conductive material for electrifying the transparent conductive member 10. The transparent conductive film 15 includes, for example, a metal thin film such as Au, Ag, Pt, Cu, Rh, Pd, Al, and Cr; a metal oxide or a conductive inorganic compound layer such as In$_2$O$_3$, CdO, CdIn$_2$O$_4$, Cd$_2$SnO$_4$, TiO$_2$, SnO$_2$, ZnO, ITO, IZO (indium zinc oxide), IGO (indium gallium oxide), IWZO (indium tungsten zinc oxide), AZO (Al doped zinc oxide) GZO (Ga doped zinc oxide), ATO (antimony tin oxide), FTO (fluorine doped tin oxide), TiN, ZrN, HfN, TiO$_x$, VO$_x$, CuI, InN, GaN, CuAlO$_2$, CuGaO$_2$, SrCu$_2$O$_2$, LaB$_6$, and RuO$_2$ and so on.

Those compounds may be crystalline or amorphous. Further, usable are materials capable of producing the transparent conductive member 10 by amorphous IDIXO (In$_2$O$_3$—ZnO) or the like. Further, usable is a conductive polymer including, for example, polyacetylene, poly(p-phenylene vinylene), polypyrrole, polythiophene, polyaniline, poly(p-phenylene sulfide) and so on. The transparent conductive film 15 may contain only one conductive material, or two or more conductive materials described above.

A method for forming the transparent conductive film 15 is not specifically limited, and conventionally known methods may be used therefor. For example, a CVD method using dry process, a vacuum deposition method, an ion plating method, and a spattering method may be used as the method for forming the transparent conductive film 15.

Preferably, the transparent conductive film 15 is formed by using a conductive metal oxide of which volume resistivity is lower than $1 \times 10^1$ Ω·cm. Here, the volume resistivity may be calculated by a film thickness and sheet resistance thereof thus measured in conformity to a resistivity test method using 4 probes of conductive plastic (JIS K 7194-1994). The film thickness may be measured by using a contact type surface profiler (e.g., DEKTAK®) and an optical interference surface profiler (e.g., WYKO®).

Preferably, the transparent conductive film 15 has sheet resistance of 10000 Ω/sq. or less, more preferably 2000 Ω/sq. or less in view of forming the optical scattering layer 12 of the transparent conductive member 10.

Preferably, the transparent conductive film 15 has a thickness in the range from 5 nm to 15 nm when using a metal thin film. Alternatively, when using a metal oxide and a conductive inorganic compound, preferably the thickness may be in the range from 10 nm to 500 nm. Further, in view of increasing conductivity, preferably the thickness is in the range from 100 nm to 500 nm, while in view of increasing surface smoothness, preferably the thickness is set to 50 nm or more.

As for the transparent conductive film 15A, a material which keeps high transparency even when the thickness is set to large may be selected preferably from a metal oxide among the above described materials. Further, when providing the transparent conductive film 15 with a thickness of about 150 nm, it is difficult to keep the transparency by using the above described metals and ITO. Therefore, it is preferable to use IZO, AZO, GZO, ATO, ZnO, SnO$_2$ and FTO for the transparent conductive film 15.

Preferably, a metal oxide usable for the transparent conductive film 15 especially includes IZO, IGO, and IWZO. Among those, preferable one is IZO having a composition represented by a mass rate of In$_2$O$_3$:ZnO=80~95:5~20. As to IGO, preferable one is IGO having a composition represented by a mass rate of In$_2$O$_3$:Ga$_2$O$_3$=70~95:5~30. Further, as to IWZO, preferable one is IWZO having a composition represented by a mass rate of In$_2$O$_3$:WO$_3$:ZnO=95~99.8:0.1~2.5:0.1 2.5.

Moreover, preferably the transparent conductive film 15 has an arithmetic mean roughness Ra (JIS B 0601: 2001) of 5 nm or less. Furthermore, preferably the arithmetic mean roughness Ra is 3 nm or less. Here, the arithmetic mean roughness Ra is measured, for example, by using an atomic force microscope (Digital Instruments).

<Method for Producing Transparent Conductive Member>

Next, a method for producing a transparent conductive member having the above described construction will be described in detail.

When the transparent conductive member 10 is prepared, first a resin substrate 11 is prepared. As to the resin substrate 11, where necessary, a gas barrier film may be prepared as the resin substrate 11 in which a gas barrier layer has been formed in advance.

[Step of Forming Optical Scattering Layer]

Next, an optical scattering layer 12 is formed on the resin substrate 11 thus prepared as mentioned above. Specifically, the optical scattering layer 12 is formed by dispersing the binder 14 and the particles 13 in a solvent to prepare a dispersion liquid used for forming an optical scattering layer, and applying the dispersion liquid onto the resin substrate 11.

Such a solvent to be used for the dispersion liquid is not specifically limited. However, it is preferable to select a solvent that does not cause precipitation of the binder 14 and agglomeration of the particles 13. In view of dispersibility, it is preferable to use a method for dispersing a liquid mixed with the binder 14 and the particles 13 via a process such as a supersonic treatment and a bead mill treatment, and subsequently filtering the dispersion liquid through a filter or the like.

Any appropriate method may be selected as a method for applying a dispersion liquid used for forming an optical scattering layer. For example, such a method includes various types of printing methods such as a gravure printing method, a flexographic printing method, an offset printing method, a screen printing method and an ink jet printing method. In addition to those, a variety of coating methods may be used including a roll coating method, a bar coating method, a dip coating method, a spin coating method, a casting method, a die coat method, a blade coating method, a curtain coating method, a spray coating method and a doctor coating method.

When the optical scattering layer 12 is formed having a predetermined pattern, it is preferable to use a gravure printing method, a flexographic method, an offset method, a screen printing method and an ink jet method.

Further, the optical scattering layer 12 is formed by applying the dispersion liquid used for forming an optical scattering layer, and subsequently drying the coating film thus formed by a known heat-drying method such as a hot-air drying method and an infrared drying method, or a natural drying method. Herein, preferably the heat-drying is conducted at a temperature of 200° C. or less. Moreover, treatments such as a curing treatment by photoenergy like ultraviolet or a heat curing treatment that causes little damage to the resin substrate 11 may be conducted depending on a material of the binder 14 thus used.

Furthermore, when a polar solvent like water having a hydroxy group or a low boiling point solvent of which boiling point is 200° C. or less is selected as a dispersion solvent that is used as a solvent forming an optical scattering layer, it is preferable to use an infrared heater in a drying method, of which filament temperature of a light source thereof is in the range from 1600° C. to 3000° C. Since a hydroxy group absorbs a specific wavelength emitted from the infrared heater, it is possible to dry the solvent.

On the other hand, when polyethylene terephthalate (PET) and polyethylene naphthalate (PEN) are used for the resin substrate 11, the resin substrate 11 is less damaged by heat because those resins less absorb the specific wavelength emitted from the infrared heater.

Such infrared heaters include, for example, a wavelength control IR (InfraRed). The wavelength control IR is an IR unit that emits infrared rays having a 5% or less rate of a spectral radiance in the wavelength of 5.8 μm per a spectral radiance in the wavelength of 3.0 μm achieved by combining a halogen heater with a filter for cutting a long wavelength region. Irradiation of the above described light in vacuo or at an inert atmosphere allows desired water content in film to be achieved in a short time.

A polar solvent having a hydroxy group includes, for example, an alcohol solvent such as methanol and ethanol, a glycol solvent, a glycol ether solvent and a mixed solvent of water and alcohol besides water (i.e. preferably pure water such as distilled water and deionized water).

More specifically, a glycol ether based organic solvent includes, for example, ethyl carbitol and butyl carbitol. Further, an alcohol based organic solvent includes, for example, besides the above described methanol and ethanol, 1-propanol, 2-propanol, n-butanol, 2-butanol, diacetone alcohol and butoxyethanol or the like.

[Step of Forming Transparent Conductive Film]

Next, a transparent conductive film 15 is formed on an entire surface of the optical scattering layer 12. The transparent conductive film 15 may be formed by a spattering method that uses the above described metal oxides as a spattering target or an ion plating method and so on.

For example, the transparent conductive film 15 may be deposited as the same as in the case of depositing a conventional metal oxide layer via various types of spattering methods and ion plating methods except for setting a temperature inside a deposition device to 200° C. or less. Setting the temperature inside the deposition device to 200° C. or less enables the transparent conductive film 15 to be prepared without generating a crystal phase in the metal oxide layer.

Herein, preferably a temperature of the substrate during the deposition step is set to 90° C. or less, more preferably especially 70° C. or less. Setting the temperature of the substrate during the deposition step is set to 90° C. or less, and preferably 70° C. or less allows the transparent conductive film to be prepared without generating a crystal phase, and also deformation of the resin substrate 11 to be prevented. Here, a temperature inside the deposition device is set to, for example, 70° C. or less so as to make a temperature of the substrate during the deposition step to 70° C. or less. Alternatively, a temperature of the substrate is made at 70° C. or less by arranging a cooling mechanism at a side of the substrate.

As a spattering method for forming the transparent conductive film 15, usable are, for example, a DC spattering method, a RF spattering method, an AC spattering method, a DC magnetron spattering method, a RF magnetron spattering method, an ECR plasma spattering method, and an ion beam spattering method and so on.

More specifically, the transparent conductive film 15 may be deposited by setting a distance between the target and substrate during the spattering process in the range from 50 mm and 200 mm and a spattering gas pressure in the range from 0.5 Pa to 1.5 Pa via a direct current magnetron spattering method.

Here, when a distance between the target and substrate is shorter than 50 mm, kinetic energy of spattering particles thus deposited becomes larger, resulting in increase in the damage of the resin substrate 11. Further, the larger kinetic energy makes thicknesses of the film uneven and distribution of the film thicknesses poor. By contrast, when the distance between the target and substrate is longer than 200 mm, distribution of the film thicknesses is improved, while kinetic energy of the spattering particles thus deposited becomes too low to cause refinement by diffusion. This results in lowering of density of the transparent conductive film 15. Therefore, it is not preferable to set the distance longer than 200 mm.

As to a spattering gas pressure, the spattering gas pressure of lower than 0.5 Pa increases kinetic energy of the spattering particles thus deposited, resulting in large damage which the resin substrate 11 receives. In contrast, the spattering gas pressure of higher than 1.5 Pa not only decreases a deposited rate but also decreases kinetic energy of the spattering particles too low to cause refinement by diffusion.

Therefore, the above pressures are not preferable because density of the transparent conductive film 15 becomes lower.

<<Organic Electroluminescence Element>>

Next, an embodiment of an organic electroluminescence element (i.e., an organic EL element) using the above described transparent conductive member will be described in detail. An organic EL element of the present embodiment has a construction in which the transparent conductive film 15 of the above described transparent conductive member is made as a first electrode (i.e., a transparent electrode), and a luminescence unit and a second electrode (i.e., a counter electrode) are provided on the first electrode. Due to the above construction feature, when the following organic EL element is described, the same construction of the above described transparent conductive member will not be described in detail and omitted.

[Construction of Organic EL Element]

A construction and materials described in JP2013-89608 may be used for those of the organic EL element of the present invention.

[Protection Member]

Further, a protection member such as a protection film or a protection sheet may be provided in order to mechanically protect the organic EL element. Such a protection member is arranged at a position where the organic EL element and a sealing member are sandwiched between the transparent conductive member 10 and the protection member. Particularly, when the sealing member is a sealing film, such a sealing film does not sufficiently protect the organic EL element mechanically. Therefore, it is preferable to arrange the above described protection member.

Herein, a glass sheet, a polymer sheet, a polymer film thinner than the polymer sheet, a metal sheet, a metal film thinner than the metal sheet, or a polymer material film and a metal material film are applied to the above described protection member. Among those materials, especially, it is preferable to use a polymer film in view of lightening a weight thereof and thinning the film.

<Method for Producing Organic Electroluminescence Element>

Figure 2:
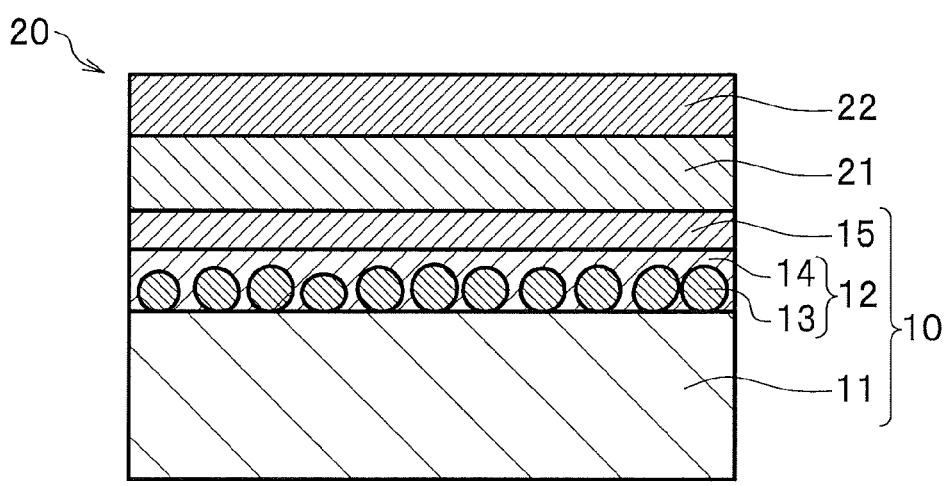
FIG. 2 is a schematic cross-sectional diagram of an organic EL element.

Next, an example of a method for producing an organic electroluminescence element 20 shown in FIG. 2 will be described in detail.

First, a transparent conductive member 10 is prepared by the above described production method.

Second, a hole injection layer, a hole transport layer, a luminescence layer, an electron transport layer, and an electron injection layer are disposed in sequence on the transparent conductive member 10, thereby to form a luminescence unit 21. A method for depositing each of those layers includes a spin coating method, a cast method, an ink jet method, a vapor deposition method, and a printing method. Herein, a most preferable one is a vacuum deposition method or a spin coating method in view of easy production of uniform films and suppression of generating pin holes. Further, different deposition methods may be adapted to the respective layers.

When a vapor deposition method is applied to deposition of each layer, the following conditions may be appropriately selected, although a deposition condition depends on a compound used in the method. That is, the conditions generally include a boat heating-temperature in the range from 50° C. to 450° C., a vacuum degree in the range from $1\times10^{-6}$ Pa to $1\times10^{-2}$ Pa, a vapor deposition rate in the range from 0.01 nm/sec to 50 nm/sec, a substrate temperature in the range from −50° C. to 300° C., a layer thickness in the range from 0.1 µm to 5 µm.

After the luminescence unit 21 is formed, a second electrode 22 is formed on an upper side of thereof by an appropriate deposition method such as a vapor deposition method or a spattering method. Herein, the second electrode 22 is formed in a pattern having a shape in which a terminal part thereof is extracted from a position above the luminescence unit 21 to a periphery of the resin substrate 11 with keeping an insulating state by the luminescence unit 21 against the optical scattering layer 12 of the transparent conductive member 10. As a result, an organic EL element 20 may be obtained. After that, a sealing member that covers at least the luminescence unit 21 is provided in a state that an extracting electrode in an organic EL element 20 and a terminal part of the second electrode 22 are exposed.

As described above, a desired organic EL element 20 may be obtained. When preparing the organic EL element 20, it is preferable to consistently prepare from the luminescence unit 21 to the second electrode 22 at a single evacuation process.

However, the resin substrate 11 may be taken out under a vacuum atmosphere in middle of the preparation, and the resin substrate 11 may be subjected to a different deposition method. At that time, it is needed to take special cares, for example, in conducting the operation under a dry inert gas atmosphere and so on.

<Other Electronic Device>

An electronic device includes, besides an organic EL element, devices requiring optical properties, for example, an organic photovoltaic (OPV) cell, a light emitting diode (LED) and an organic light emitting diode (OLED).

Next, an example of the electronic device other than the organic EL element will be explained in detail.

Figure 3:
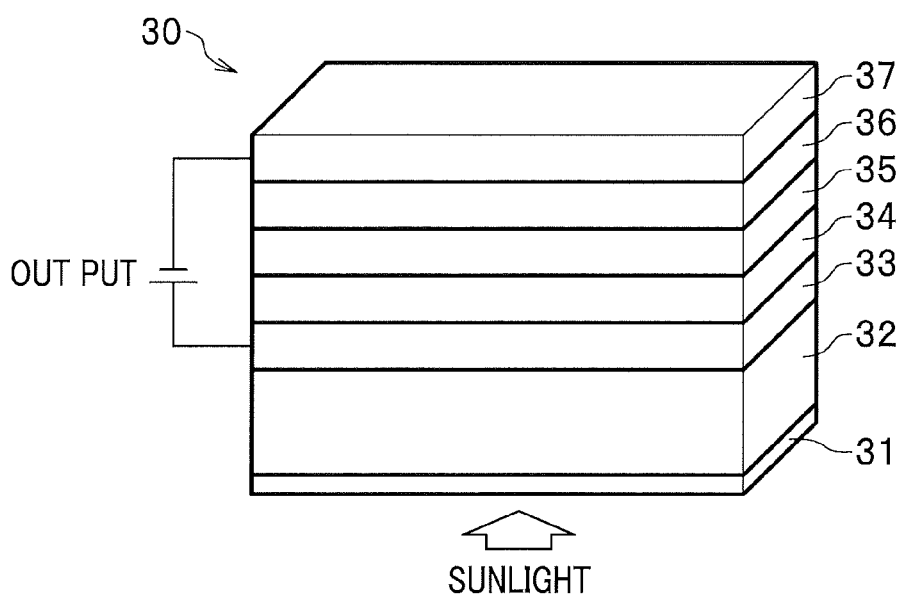
FIG. 3 is a schematic diagram of an organic photovoltaic cell.

FIG. 3 is a schematic diagram showing an organic photovoltaic (OPV) cell having a functional layer defined in the present invention.

As shown in FIG. 3, the organic photovoltaic cell 30 is provided with a functional layer (i.e., a transparent member) 31, a transparent substrate (i.e., a resin substrate) 32, a transparent electrode (i.e., an anode (ITO) 33, a hole transport layer 34, an organic power generation layer 35, an electron transport layer 36, and an electrode (i.e., a cathode (Ca/Al)) 37 in this order. The organic photovoltaic cell 30 shown in FIG. 3 has the functional layer 31 defined in the present invention is arranged on a lower side of the transparent substrate 32. This construction allows improvement of power conversion efficiency and scratch resistance.

Figure 4:
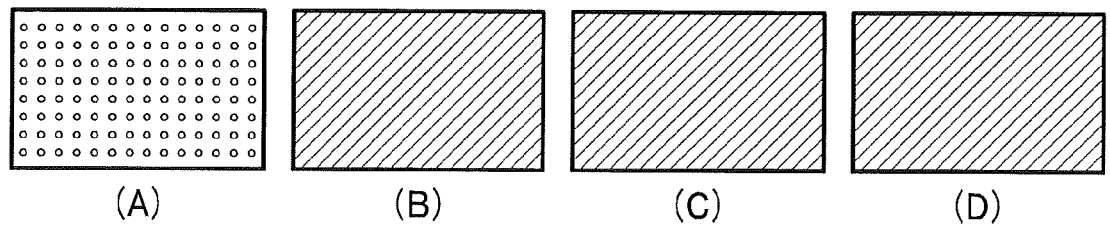
FIG. 4 shows a schematic top view of a luminescent diode using no diffusion film, and luminescent diodes each using a diffusion film that contains a resin component prescribed in the present application.

FIG. 4 shows a schematic top surface view of a light emitting diode (LED) that uses no diffusion film, and light emitting diodes (LEDs) each of which uses a functional layer as a diffusion film containing a resin component defined in the present application. Herein, a LED using a diffusion film has a construction in which the diffusion film is arranged on a top surface of the LED.

In FIG. 4, view (A) represents a LED using no diffusion film; view (B) represents a LED using a typical diffusion sheet as a functional layer that contains a resin component defined in the present invention and is used as a diffusion film having a transparent rate of 90%; view (C) represents a LED using a nanobuckling sheet (i.e., 2 sheet cross Nicol arrangement) as a functional layer that contains a resin component defined in the present invention and is used as a diffusion film having a transparent rate of 80%; and view (D) represents a LED using a typical diffusion plate as a functional layer that contains a resin component defined in the present invention and is used as a diffusion film having a transparent rate of 65%.

Note, FIG. 4 shows simplified top surface views of a light emitting diode for convenience. Herein, for convenience, views (B), (C) and (D) are shown as the same each of which is provided with a diffusion film.

In views (B) and (C) of FIG. 4, relative downlight luminescence is 100, and in view of (D) the relative downlight luminescence is 68. Note, the relative downlight luminescence is relatively represented luminescence when each light source is viewed in the vertical direction. A maximum value of luminescence when measured is defined as 100, and each of luminescence values is relatively represented based thereon.

In light emitting diodes shown in views (B), (C) and (D) of FIG. 4, a functional layer defined in the present invention is disposed on a top surface of each light emitting diode. This construction enables improvement of the light extraction efficiency and scratch resistance of the LED.

Hereinbefore, the embodiment of the present invention has been described in detail. However, the present invention is not limited to the above embodiment. For example, the organic EL element has been described as having a transparent conductive member provided with a functional layer defined in the present invention. On the contrary, members other than the transparent conductive member may be adapted to the organic EL element of the present invention.

As described above, the electronic device of the present embodiment is excellent in the optical properties, which results in improvement of, for example, power conversion efficiency and luminescence efficiency. Further, when a member having a functional layer containing a resin component defined in the present invention is arranged inside the electronic device, this construction improves long-term storage stability. Moreover, when a member having a functional layer containing a resin component defined in the present invention is arranged outside the electronic device, this construction improves scratch resistance.

Note, the long-term storage stability described herewith means performance for causing no dark spot when the electronic device is driven for a long time at a high temperature (e.g., 85° C.). The scratch resistance means performance by which the electronic device is hard to be damaged when a surface of a functional layer containing a resin component defined in the present invention is rubbed.

EXAMPLES

Hereinafter, the present invention will be described more specifically referring to Examples. However, the present invention is not limited to those Examples.

Here, numerals of X and X', and numerals at both ends of Y construction (e.g., (1)) in Tables correspond compounds of the formulae (1)~(12) described in the present specification. Further, in Tables, PMMA is methyl polymethacrylate, and P/B is a rate of a particle volume to a total of binder volume and particle volume [Particle Volume/(Particle Volume+ Binder Volume)×100. Moreover, in Tables, a particle diameter is a mean particle diameter of all the particles, and a presence rate at a side of the substrate is a volume rate of particles present at a side of the substrate.

Next, structures of compounds used in Examples will be described below.

(Initiator A)

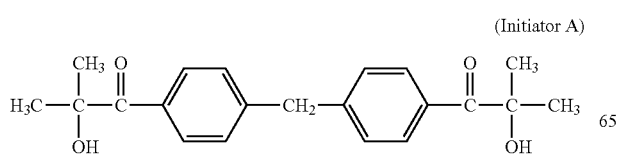

Ti(OC$_4$H$_9$)$_4$ (Ti-A)

HT-1

A-1

A-2

A-3

H-1

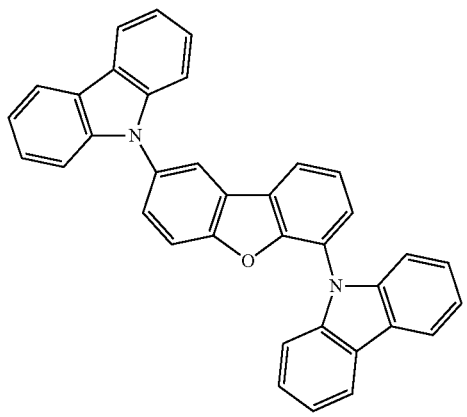

ET-1

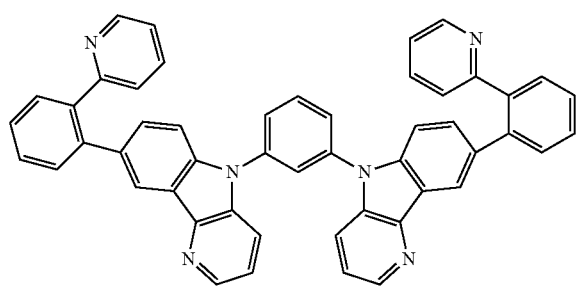

Example 1

In Example 1, properties were evaluated of the organic photovoltaic (OPV) element in which a functional layer containing a resin component defined in the present application was deposited.

Here, a resin construction was prepared by selecting X, X' and Y except for sample No. 101 and adding an initiator A so as to make a composition described in Table 2. Herein, sample No. 101 was an organic photovoltaic element which used a plastic film described later and no functional layer was deposited thereon.

Preparation of Sample No. 102

A coating liquid containing a resin construction of 98 mass % and an initiator A of 2 mass % described in Table 2 was applied to one surface side of a plastic film (MAS-TACK® TFB ZBO-0421, FUJIMORI KOGYO CO., LTD.) having a thickness of 38 μm and in which the opposite side had been separately coated with an adhesive. Then, the resulting film was subjected to simple drying (e.g., 70° C., 2 min), and further subjected to drying treatment for 5 min by a wavelength control IR described later under output conditions of a substrate temperature less than 80° C.

Here, a wavelength control infrared heater was used as the wavelength control IR. The heater was prepared by attaching two plates of quartz glass, which absorbed infrared rays having a wavelength of 3.5 μm or more, to an infrared irradiation device (Ultimate Heater/Carbon, Meimei Kogyo Kabushiki Kaisha). Herein, a cooling air was allowed to flow between the glass plates during the dry treatment.

Next, a curing reaction was facilitated under the following reforming treatment conditions thereby to produce a functional film with a thickness of 0.25 μm served as a functional layer (i.e., a resin layer).

(Reforming Treatment Device)

Device: Excimer Lamp, MODEL MEIRH-M-1-200-222-H-KM-G, M.D.COM., Inc.)

Wavelength: 222 nm

Lamp Filler Gas: KrCl (Reforming Treatment Conditions)

Excimer Light Intensity: 8 J/cm$^2$ (222 nm)

Stage Heating Temperature: 60° C.

Oxygen Concentration inside Lamp: Atmospheric Air

The prepared functional film was attached to a light receiving surface of the organic photovoltaic cell thereby to produce an evaluation element.

Preparation of Sample No. 103

Organic photovoltaic cell No. 103 was prepared as the same in sample No. 102 except that conditions were changed to those of the resin construction described in Table 2.

Preparation of Sample No. 104

Organic photovoltaic cell No. 104 was prepared the same as in sample No. 103 except that an organic titanium compound (Ti-A) of 20 mass % was added to a resin component of the application liquid.

The prepared organic photovoltaic cells were evaluated as follows. Note, in Example 1, the functional film was deposited outside the organic photovoltaic cell. Thus, scratch resistance thereof was evaluated, but long-term storage stability (i.e., storage stability at 85° C.) was not evaluated because the storage stability was influenced when the film was deposited inside the cell.

[Power Conversion Efficiency]

Power generated by light irradiation was defined by a power conversion efficiency, and the power conversion efficiency was calculated as a relative value by setting a power conversion efficiency of sample No. 101 to 1.00. Herein, an organic photovoltaic cell having a power conversion efficiency of 1.05 or more was evaluated as an accepted cell.

The evaluation was carried out by using a solar light generation array tester SIV-600 (Shin-ei Electronic Measuring Co., Ltd.)

[Scratch Resistance]

An abrasion property was evaluated by using No. 650-F Tribological Tester (i.e., a reciprocal frictional abrasion tester: YASUDA SEIKI SEISAKUSYO, LTD.). The evaluation was carried out under the following conditions: by using a ball shaped SUS friction block, friction rate of 100 mm/sec; a load of 100 gf; and 10 times reciprocation, thereby to evaluate a degree of damage. Here, a sample having an apparently noticeable damage was evaluated as poor, a sample having no appearance of damage or a sample difficult to be observed of damage was evaluated in excellence.

Table 2 shows constructions of resins thus used therein and results in the evaluation. Here, components not included in the samples are indicated by a mark of "-" in Table 2.

TABLE 2

| | | Resin Construction | | | | Results of Evaluation | | |
|---|---|---|---|---|---|---|---|---|
| No. | X, X' | Y Construction | Ti Component | Refractive Index | Thikness of Resin Layer | Power Conversion Efficiency | Scratch Resistanc | Note |
| 101 | — | — | — | — | — | 1.00 | Poor | Com. Example |
| 102 | (2) | -(8)-(8)- | — | 1.74 | 250 nm | 1.01 | Excellent | Com. Example |
| 103 | (2) | -(8)-S-(8)- | — | 1.82 | 250 nm | 1.06 | Excellent | Invention |
| 104 | (6) | -(8)-S-(8)- | Ti-A | 1.90 | 250 nm | 1.09 | Excellent | Invention |

Com. Example: Comparative Example

As shown in Table 2, samples Nos. 103 and 104 both satisfying requirements of the present invention were evaluated all in excellent.

By contrast, sample No. 101 was evaluated in poor because the sample had no functional layer which contained a resin component defined in the present application. Further, sample No. 102 was evaluated in poor in the power conversion efficiency because Y composition thereof contained no S.

Example 2

In Example 2, properties were evaluated of LED lamps each attached with a functional film containing a resin component defined in the present application.

Resin constructions were prepared by selecting X, X' and Y and adding an initiator A except for samples Nos. 201 and 202 so that the compositions became those described in Table 3. Note, sample No. 201 was an LED lamp having no functional film.

Preparation of Sample No. 202

Prepared was a liquid in which a solid content rate of $TiO_2$ particles having a refractive index of 2.30, a rate in 85% or less of a number of particles with an aspect rate of 2 or less (R-42, SAKAI CHEMICAL INDUSTRY CO., LTD.) to a resin solution (TOKYO CHEMICAL INDUSTRY CO., LTD.; methyl methacrylate) was set to 5 volume % (particles)/95 volume % (resin). The resulting liquid was applied to one side of a plastic film (MASTACK® TFB ZBO-0421, FUJIMORI KOGYO CO., LTD.) having a thickness of 38 µm and the other side opposite thereto had been separately coated with an additive, whereby a functional film was prepared.

More specifically, the above described $TiO_2$ particles, a solvent and an additive were mixed respectively at a mass rate of 10% per the $TiO_2$ particles. Then, the resulting mixture was cooled at an ambient temperature (i.e., 25° C.), and while being cooled, the mixture was dispersed by a supersonic disperser (SMT CO., LTD., UH-50) for 10 min under the standard conditions of Micro Tip Step (SMT CO., LTD., MS-3 [3 mmϕ]), whereby a dispersion liquid was prepared.

Next, while stirring the $TiO_2$ dispersion liquid at 100 rpm, the resin solution was gradually added thereto. After completion of the addition, a stirring rate of the dispersion liquid was increased up to 500 rpm, and the liquid was mixed for 10 min. Then, the liquid was filtered through a hydrophobic PVDF 0.45 µm filter (Whatmann), whereby a desired application liquid for a functional film was prepared.

The resultant application liquid was applied by an ink jet coating method to one side of a plastic film having a thickness of 38 µm, opposite to the other side separately having coated in advance with an adhesive. Then, the plastic film thus coated was subjected to simple drying (70° C., 2 min), and further subjected to dry treatment for 5 min under output conditions of a substrate temperature less than 80° C. by a wavelength control IR described later.

As for the wavelength control IR, used was a wavelength control infrared heater which was prepared by attaching two plates of quartz glass, which absorbed infrared rays having a wavelength of 3.5 µm or more, to an infrared irradiation device (Ultimate Heater/Carbon, Meimei Kogyo Kabushiki Kaisha). Herein, a cooling air was allowed to flow between the glass plates during the dry treatment.

Next, a curing reaction was facilitated under the following reforming treatment conditions, thereby to produce a functional film with a thickness of 0.25 µm served as a functional layer (i.e., an optical scattering layer).

(Reforming Treatment Device)
Device: Excimer Lamp, MODEL MEIRH-M-1-200-222-H-KM-G, M.D.COM., Inc.)
Wavelength: 222 nm
Lamp Filler Gas: KrCl
(Reforming Treatment Conditions)
Excimer Light Intensity: 8 $J/cm^2$ (222 nm)
Stage Heating Temperature: 60° C.
Oxygen Concentration inside Lamp: Atmospheric Air The prepared functional film was attached to a surface of a surface mounting white LED element (OptoSupply Limited, OSWT1608C1A-W25), thereby to produce an evaluation element.

Preparation of Sample No. 203

Led lamp sample No. 203 was prepared the same as in sample No. 202 except that an application liquid was changed to a liquid containing components of the resin construction of 98 mass % and an initiator A of 2 mass % listed in Table 3.

Preparation of Sample No. 204

LED lamp sample No. 204 was prepared the same as in sample No. 203 except that conditions of the resin construction were changed to those as listed in Table 3.

Preparation of Sample No. 205

LED lamp sample No. 205 was prepared the same as in sample No. 204 except that a resin construction was changed by adding an organic titanium compound (Ti-A) of 20 mass % to the resin composition.

The prepared LED lamps were evaluated in the following properties. Note, in Example 2, the functional film was arranged outside the LED lamp. Thus, the LED lamp in Example 2 was evaluated in scratch resistance, but was not evaluated in the long-term storage stability (i.e., 85° C. storage stability) that was influenced when the functional film was arranged inside the lamp.

[Luminescence Efficiency]
(Total Luminous Flux)

Luminous fluxes of the prepared samples were evaluated at a constant current by using an integrating sphere. Specifically, the total luminous fluxes were measured at a current density of 5 mA/m$^2$. Herein, a luminescence efficiency of each sample was calculated as a relative value to the luminescence efficiency of sample No. 201 thus set to 1.00. Samples having a value of 1.20 or more were evaluated in acceptable.

[Scratch Resistance]

The scratch resistance was evaluated the same as in Example 1.

Table 3 shows constructions and evaluation results of the used functional films. Note, in Table 3, components which were not included are represented by a mark of "-"

Example 3

In Example 3, properties were evaluated of the organic EL (OLED) elements each of which used the functional layer containing a resin component satisfying the requirements of the present application as an optical film (OCF: Out Coupling Film).

<<Preparation of Organic EL Element>>
<Preparation of Film>
[Substrate]
(Preparation of Substrate)

A polyethylene terephthalate (PET) film (TORAY INDUSTRIES, INC., Lumirror® U48) having a thickness of 100 μm and a width of 350 mm was prepared as a resin substrate.

(Preparation of Primer Layer)

A primer layer (i.e., an underlayer) was formed by applying a UV curing organic/inorganic hybrid hard coat material (OPSTARR Z7501, JSR Corporation) to an easy contact surface of the resin substrate by using a wire bar so that a thickness of a layer became 4 μm after applied and dried, drying the resultant product under the conditions of 80° C. and 3 min; and subsequently curing the dried product via using a high pressure mercury lamp under the conditions of 1.0 J/cm$^2$ under an atmosphere of air.

(Formation of Gas Barrier Layer)

A PET film on which a primer layer was formed was cut off in the dimension of 120 mm×100 mm. Then, a silicon-containing polymer reforming layer was formed on the primer layer in the following process.

An application liquid was prepared by mixing a dibutyl ether solution of a perhydropolysilazane (20 mass %) (AQUAMICA®, NN120-20, AZ Electronic Materials, plc.) containing no catalyst and a dibutyl ether solution of a perhydropolysilazane (20 mass %) (AQUAMICA®, NAX120-20, AZ Electronic Materials, plc.) containing an amine catalyst (N,N,N',N'-tetramethyl-1,6-diaminohexane)

TABLE 3

| No. | Functional Film | Resin Construction | | | | | Particle | | |
|-----|-----------------|-----|-----|-----|-----|-----|-----|-----|-----|
| | | X, X' | Y Construction | Ti Component | Others | Index[1] | Particle Name | Particle Diameter | Index[1] |
| 201 | Absent | — | — | — | — | — | — | — | — |
| 202 | Present | — | — | — | PMMA | 1.49 | R-42 | 290 nm | 2.30 |
| 203 | Present | (1) | -(8)-S-(8)- | — | — | 1.80 | R-42 | 290 nm | 2.30 |
| 204 | Presen | (2) | -(8)-S-(8)- | — | — | 1.82 | R-42 | 290 nm | 2.30 |
| 205 | Present | (2) | -(8)-S-(8)- | Ti-A | — | 1.89 | R-42 | 290 nm | 2.30 |

| No. | Basic Properties | | | Results of Evaluation | | |
|-----|-----|-----|-----|-----|-----|-----|
| | Difference[2] | P/B | Thikness[3] | Efficiency[4] | Scratch Resistance | Note |
| 201 | — | — | — | 1.00 | Excellent | Com. Example |
| 202 | 0.81 | 5 vol % | 250 nm | 1.05 | Poor | Com. Example |
| 203 | 0.50 | 5 vol % | 250 nm | 1.25 | Excellent | Invention |
| 204 | 90.48 | 5 vol % | 250 nm | 1.20 | Excellent | Invention |
| 205 | 0.41 | 5 vol % | 250 nm | 1.30 | Excellent | Invention |

[1]Refractive Index;
[2]Difference in Refractive Indexes;
[3]Thickness of Optical Scattering Layer;
[4]Luminescence Efficiency;
Com Example: Comparative Example As shown in Table 3, samples Nos. 203~205 that satisfied the requirements of the present invention were excellent in all of the evaluation results.

On the other hand, sample No. 201 was poor in the luminescence efficiency because the sample did not have a functional film. Further, sample No. 202 was poor in the luminescence efficiency and scratch resistance because the sample did not contain a resin component of the X—Y—X' structure.

(5 mass % as a solid) at a rate of 4:1, and appropriately diluting the mixture by dibutyl ether in order to adjust a thickness of an applied layer.

The prepared application liquid was applied onto the primer layer by a die coater so that a thickness after dried became 100 nm, and dried for 2 min at 80° C. Then, a silicon-containing polymer reforming layer was formed by using a Xe excimer lamp with a wavelength of 172 nm as a vacuum ultraviolet irradiation device, and conducting a reforming treatment for a deposit film after dried via irradiating ultraviolet rays of 2.5 mJ/cm$^2$ by using the vacuum ultraviolet irradiation device. When irradiating vacuum ultraviolet rays, the atmosphere was replaced by nitrogen so that the replaced atmosphere had an oxygen concentration of 0.1 volume %. Further, a temperature of a stage on which the PET film was placed was set to 80° C., and a rate of transporting the stage was set to 0.5 m/min.

Then, a silicon compound layer having a thickness of 300 nm was formed by a plasma CVD method, thereby to produce a support substrate provided with a gas barrier layer.

Conditions of depositing the silicon compound layer are summarized as follows.

Feed Rate of Raw Material Gas (Hexamethyldisiloxane: HMDSO): 50 sccm (Standard Cubic Centimeter per Minute)

Rate of Feeding Oxygen Gas ($O_2$): 500 sccm

Vacuum Degree inside Vacuum Chamber: 3 Pa

Applied Power from Power Source of Generating Plasma: 1.2 kW

Frequency from Power Source of Generating Plasma: 80 kHz

Rate of Transporting Film: 0.5 m/min

Further, a silicon-containing polymer reforming layer was applied with a thickness of 300 nm the same as described above, and subjected to ultraviolet curing.

(Formation of First Electrode) A target of $In_2O_3$: ZnO (90 mass %: 10 mass %) was attached to a commercially available spattering device, and an anode made of IZO having a thickness of 250 nm was formed under the following conditions.

Total Pressure: 0.4 Mpa

Argon Flow Rate: 99 sccm

Oxygen Flow Rate: 1 sccm

Output: 5 W/cm$^2$ (Formation of Luminescence Layer)

A transparent conductive member was held by a substrate holder of a commercially available vacuum deposition device, and the following compounds that formed a luminescence unit were respectively put into resistance-heating boats of tungsten. Then, the substrate holder and the respective heating boats were attached inside a vacuum chamber of the vacuum deposition device. Next, the vacuum chamber of the vacuum deposition device was vacuumed to a vacuum degree of $1\times10^{-4}$ Pa, and then, compound HT-1 was deposited at a deposition rate of 0.1 nm while moving the transparent conductive member, whereby a hole transport layer (HTL) with a thickness of 20 nm was produced.

Next, compound A-3 (blue luminescence dopant), compound A-1 (green luminescence dopant), compound A-2 (red luminescence dopant) and compound H-1 (host compound) were co-deposited under the following conditions so that a luminescence layer had a thickness of 70 nm, whereby the luminescence layer was formed.

Herein, a deposition rate of compound A-3 was changed dependent on a position so that compound A-3 linearly had a concentration of 5~35 mass % against a film thickness. By contrast, deposition rates of compound A-1 and compound A-2 were set to 0.0002 nm/sec independent on a layer thickness thereof, so that each compound had a concentration of 0.2 mass %. Finally, a deposition rate of compound H-1 was changed dependent on a position, so that compound H-1 had a concentration of 64.6~94.6 mass %.

After that, compound ET-1 was deposited with a thickness of 30 nm to form an electron transport layer, and further a potassium fluoride (KF) layer was formed with a thickness of 2 nm. Moreover, aluminum was deposited with a thickness of 110 nm, whereby a counter electrode was formed.

(Formation of Sealing Material)

[Preparation of Adhesive Composition]

An adhesive composition having a solid concentration of about 25 mass % was prepared by dissolving in toluene OPPANOL® B50 (BASF, Mw: 340,000) of 100 parts by mass served as a polyisobutylene resin (A); Nisseki Polybutene Grade HV-1900 (Nippon Oil Corporation, Mw: 1900) of 30 parts by mass served as a polybutene resin (B); TINUVIN® 765 (BASF Japan Ltd., having a tertiary hindered amino group) of 0.5 part by mass served as a hindered amine photostabilizer (C); IRGANOX® 1010 (BASF Japan Ltd., tert-butyl groups located at both β-positions of the hindered phenol group) of 0.5 part by mass served as a hindered phenol oxidation inhibitor (D); and an Eastotac® H-100L Resin (Eeastman Chemical Co.) of 50 parts by mass served as a cyclic olefin polymer (E). As a result, the adhesive composition having a solid concentration of about 25 mass % was prepared.

(Preparation of Sealed Substrate)

A support substrate provided with a gas barrier layer thus produced as mentioned above was used just as it was for a substrate before attached with a film described below. Next, a solution of the prepared adhesive composition described above was applied to a surface at a side of a cathode (i.e., at a side of the gas barrier layer) of the sealing substrate so that an adhesive layer to be formed after dried had a thickness of 20 μm. Then, the resultant substrate was dried for 2 min at 120° C. thereby to form an adhesive layer. Next, a peeling-treated surface of a polyethylene terephthalate film having a thickness of 38 μm and subjected to the pealing treatment was attached as a peeling sheet to the resultant substrate. Accordingly, a sealed substrate was produced.

The sealed substrate thus produced by the above method was left as it was for 24 hr or more under nitrogen atmosphere. After that, the peeling sheet was removed and the resultant substrate was laminated by a vacuum laminator which had been heated to 80° C. so that a cathode of the organic luminescence element was covered. Further, the resultant substrate was heated for 30 min at 120° C. to be sealed, whereby sample No. 301 was produced.

Preparation of Sample No. 302

An optical film (OCF) having a thickness of the functional layer (i.e., an optical scattering layer) of 0.25 μm was produced the same as in sample No. 202.

Then, an element was produced the same as in sample No. 301. The produced optical film was attached to a luminescence surface of the above described organic EL element, and the resultant product was used for an evaluation element.

Preparation of Sample No. 303

Organic EL element sample No. 303 was prepared the same as in sample 302 except that an applied liquid was changed to a liquid containing a component of the resin construction of 98 mass % and an initiator A of 2 mass % as listed in Table 4.

Preparation of Sample No. 304

Organic EL element sample No. 304 was produced the same as in sample No. 303 except that a resin construction was changed in the conditions as listed in Table 4.

Preparation of Sample No. 305

Organic EL element sample No. 305 was produced the same as in No. 304 except that an organic titanium compound (Ti-A) of 20 mass % was added to a resin construction as a component thereof.

The produced organic EL elements were evaluated as follows. Note, in Example 3, OCF was arranged outside the organic EL element. Therefore, in Example 3, scratch resistance was evaluated, but long-term storage stability (i.e., 85° C. storage stability) which was influenced when OCF was arranged inside the organic EL element was not evaluated.

[Luminescence Efficiency]
(Total Luminous Flux)

Luminous fluxes of the prepared samples were evaluated at a constant current by using an integrating sphere. Specifically, the total luminous fluxes were measured at a current density of 20 A/m². Herein, a luminescence efficiency of each sample was calculated as a relative value to the luminescence efficiency of sample No. 301 thus set to 1.00. Samples having a value of 1.20 or more were evaluated in acceptable

[Scratch Resistance]

The scratch resistance was evaluated the same as in Example 1.

Table 4 shows constructions and evaluation results of OCFs thus used therein. Note, a component which is not contained in the composition is represented by a mark of "-"

As shown in Table 4, samples Nos. 303~305 that satisfied the requirements of the present invention were excellent in all of the evaluation results.

By contrast, sample No. 301 was poor in the luminescence efficiency because the sample included no OCF. Similarly, sample No. 302 was poor in the luminescence efficiency and scratch resistance because the sample did not contain a resin component of the X—Y—X' structure.

Example 4

In Example 4, properties were evaluated of the organic EL elements (OLEDs) in which a functional layer that contained a resin component thus defined in the present application was used for an internal light extraction structure (ISE).

Preparation of Sample No. 401

Sample No. 401 was prepared the same as in sample No. 301 because the substrate of sample No. 401 had the same construction as in sample No. 301.

Preparation of Sample No. 402

Sample No. 402 was prepared the same as in sample No. 401 by the preparation of a gas barrier layer of the substrate.

Prepared was a liquid in which a solid content rate of $TiO_2$ particles having a refractive index of 2.30, a mean particle diameter of 290 nm, a rate in 65% of a number of particles with an aspect rate of 2 or less (TAYCA CORPORATION, JR-805) to a resin solution (TOKYO CHEMICAL INDUSTRY CO., LTD.; methyl methacrylate) was set to 10 volume % (particles)/90 volume % (resin). Using the resulting liquid, an optical scattering layer (IES) was formed on the above described substrate (i.e., on the gas barrier layer).

More specifically, the above described $TiO_2$ particles, a solvent and an additive were mixed at a mass rate of 10% per the $TiO_2$ particles. Then, the resulting mixture was cooled at

TABLE 4

| | | Resin Construction | | | | Particle | | |
|---|---|---|---|---|---|---|---|---|
| No: | Functional Film | X, X' | Y Construction | Ti Component | Others | Index[1] | Particle Name | Particle Diameter | Index[1] |
| 301 | Absent | — | — | — | — | — | — | — | — |
| 302 | Present | — | — | — | PMMA | 1.49 | R-42 | 290 nm | 2.30 |
| 303 | Present | (2) | -(8)-S-(8)- | — | — | 1.82 | R-42 | 290 nm | 2.30 |
| 304 | Present | (6) | -(8)-S-(8)- | — | — | 1.83 | R-42 | 290 nm | 2.30 |
| 305 | Present | (6) | -(8)-S-(8)- | Ti-A | — | 1.90 | R-42 | 290 nm | 2.30 |

| | Basic Properties | | | Results of Evaluation | | |
|---|---|---|---|---|---|---|
| No: | Difference[2] | P/B | Thikness[3] | Efficiency[4] | Scratch Resistance | Note |
| 301 | — | — | — | 1.00 | Excellent | Com. Example |
| 302 | 0.81 | 5 vol % | 250 nm | 1.05 | Poor | Com. Example |
| 303 | 0.48 | 5 vol % | 250 nm | 1.20 | Excellent | Invention |
| 304 | 0.47 | 5 vol % | 250 nm | 1.20 | Excellent | Invention |
| 305 | 0.40 | 5 vol % | 250 nm | 1.25 | Excellent | Invention |

[1]Refractive Index;
[2]Difference in Refractive Indexes;
[3]Thickness of Optical Scattering Layer;
[4]Luminescence Efficiency an ambient temperature (i.e., 25° C.), and while being cooled, the mixture was dispersed by a supersonic disperser (SMT CO., LTD., UH-50) for 10 min under the standard conditions of Micro Tip Step (SMT CO., LTD., MS-3 [3 mmϕ]), thereby to prepare a dispersion liquid of $TiO_2$.

Next, while stirring the $TiO_2$ dispersion liquid at 100 rpm, the resin solution was gradually added thereto. After completion of the addition, a stirring rate of the dispersion liquid was increased up to 500 rpm, and the liquid was mixed for 10 min. Then, the resultant liquid was filtered through a hydrophobic PVDF 0.45 μm filter (Whatmann), thereby to produce a desired application liquid used for a functional film.

The resultant application liquid was applied to one surface of a plastic film substrate at a side of the gas barrier layer (i.e., on the gas barrier layer). Then, the plastic film layer thus coated was subjected to simple drying (70° C., 2 min), and further subjected to dry treatment by a wavelength control IR described later, for 5 min under output conditions of a substrate temperature less than 80° C.

As to the wavelength control IR, used was a wavelength control infrared heater which was prepared by attaching two plates of quartz glass, which absorbed infrared rays having a wavelength of 3.5 μm or more, to an infrared irradiation device (Ultimate Heater/Carbon, Meimei Kogyo Kabushiki Kaisha). Herein, a cooling air was allowed to flow between the glass plates during the dry treatment.

Next, a curing reaction was facilitated under the following reforming treatment conditions, thereby to produce an optical scattering layer with a thickness of 0.50 μm.

(Reforming Treatment Device)
Device: Excimer Lamp, MODEL MEIRH-M-1-200-222-H-KM-G, M.D.COM., Inc.)
Wavelength: 222 nm
Lamp Filler Gas: KrCl
(Reforming Treatment Conditions)
Excimer Light Intensity: 8 J/cm$^2$ (222 nm)
Stage Heating Temperature: 60° C.
Oxygen Concentration inside Lamp: Atmospheric Air After that, a luminescence layer unit was deposited the same as in sample No. 301.

Preparation of Sample No. 403

Organic EL element sample No. 403 was prepared the same as in sample No. 402 except that conditions were changed to those in Table 5.

Preparation of Sample Nos. 404~415, 417~429 and 434

Organic EL element Samples Nos. 404~415, 417~429 and 434 were prepared the same as in sample No. 403 except that an application liquid was changed by modifying a content of a component of the resin construction and a content of an initiator A in the preparation of the above sample 403 to 98 mass % and 2 mass % respectively as listed in Table 5.

Here, as to particles in Table 5, B-34 represents $BaSO_4$ particles having a reflective index of 1.64, a mean particle diameter of 0.30 μm, and a rate in 85% of a number of particles with an aspect rate of 2 or less (SAKAI CHEMICAL INDUSTRY CO., LTD.); SG-TO100 represents $TiO_2$ particles having a reflective index of 2.40, a mean particle diameter of 100 nm, and a rate in 90% of a number of particles with an aspect rate of 2 or less (Sukgyng AT Co., Ltd.); MP-6035 represents acrylic particles having a reflective index of 1.48, a mean particle diameter of 450 nm, a rate in 100% of a number of particles with an aspect rate of 2 or less (Soken Chemical & Engineering Co., Ltd.); and BT-HP9DX represents $BaTiO_3$ having a reflective index of 2.42, a mean particle diameter of 300 nm, and a rate in 85% of a number of particles with an aspect rate of 2 or less (NORITAKE CO., LIMITED).

Preparation of Sample Nos. 416 and 430~433

Organic EL element sample Nos. 416 and 430~433 were prepared the same as in sample No. 415 except that 20 mass % of the organic titanium compound (Ti-A) was added to the resin construction and conditions were changed to those listed in Table 5.

The organic EL elements thus prepared were evaluated as follows. Note, in Example 4, the optical scattering layer was arranged inside the organic EL element. Thus, in Example 4, long-term storage stability (i.e., 85° C. storage stability) was evaluated, but scratch resistance which was influenced when the optical scattering layer was arranged outside was not evaluated.

[Luminescence Efficiency]

(Total Light Flux)

Total light fluxes were measured the same as in Example 3. Here, luminescence efficiency of each sample was calculated as a relative value by setting luminescence efficiency of sample No. 401 to 1.00, and each sample having a value of 1.20 or more was evaluated in acceptable.

[Long-Term Storage Stability]

Each sample was put into a thermostatic chamber kept at 85° C. (dry), and voltage rising rates at constant current density before and after the storage were evaluated every 24 hr the same as in the above described luminescence efficiency evaluation.

Herein, an element of which voltage rising rate was more than 1.0V or which caused a dark spot of 0.5 mm or more after initiation of the evaluation were determined to be unacceptable.

A period (i.e., the number of days) thus determined as unacceptable was classified into 5 ranks, and each of the storage stability was defined by those ranks.

Rank 5: after starting storage, in a period over 500 hr, no voltage rise more than 1.0 V occurred, or no dark spot of 0.5 mm or more was generated in a sample.

Rank 4: after starting storage, in a period over 300 hr and within 500 hr, a voltage rise of more than 1.0 V occurred, or a dark spot of 0.5 mm or more was generated in a sample.

Rank 3: after starting storage, in a period over 100 hr and within 300 hr, a voltage rise of more than 1.0 V occurred, or a dark spot of 0.5 mm or more was generated in a sample.

Rank 2: after starting storage, in a period over 24 hr and within 100 hr, a voltage rise of more than 1.0 V occurred, or a dark spot of 0.5 mm or more was generated in a sample.

Rank 1: after starting storage, in a period within 24 hr, a voltage rise of more than 1.0 V occurred, or a dark spot of 0.5 mm or more was generated in a sample.

Herein, samples of rank 3 or more were evaluated in acceptable.

Table 5 shows constructions and evaluation results of the used IESs. Here, in Table 5, a component that was not contained is represented by a mark of "-"

TABLE 5

| No. | IES | X, X' | Y Construction | Ti Component | Others | Refractive Index | Particle Name | Ratio[1] | Particle Diameter | Refractive Index |
|---|---|---|---|---|---|---|---|---|---|---|
| | | | Resin Construction | | | | Particle | | | |
| 401 | Absent | — | — | — | — | — | — | — | — | — |
| 402 | Present | — | — | — | PMMA | 1.49 | JR-805 | 65number % | 290 nm | 2.30 |
| 403 | Present | — | — | — | PMMA | 1.49 | R-42 | 85number % | 290 nm | 2.30 |
| 404 | Present | (2) | -(8)-S-(8)- | — | — | 1.82 | R-42 | 85number % | 290 nm | 2.30 |
| 405 | Present | (2) | -(8)-S-(8)- | — | — | 1.82 | R-42 | 85number % | 290 nm | 2.30 |
| 406 | Present | (2) | -(8)-S-(8)- | — | — | 1.82 | R-42 | 85number % | 290 nm | 2.30 |
| 407 | Present | (2) | -(8)-S-(8)- | — | — | 1.82 | R-42 | 85number % | 290 nm | 2.30 |
| 408 | Present | (2) | -(8)-S-(8)- | — | — | 1.82 | B-34 | 85number % | 300 nm | 1.64 |
| 409 | Present | (2) | -(8)-S-(8)- | — | — | 1.82 | SG-TO100 | 90number % | 100 nm | 2.40 |
| 410 | Present | (2) | -(8)-S-(8)- | — | — | 1.82 | MP-6035 | 100number % | 450 nm | 1.48 |
| 411 | Present | (2) | -(8)-S-(8)- | — | — | 1.82 | R-42 | 85number % | 290 nm | 2.30 |
| 412 | Present | (2) | -(8)-S-(8)- | — | — | 1.82 | R-42 | 85number % | 290 nm | 2.30 |
| 413 | Present | (2) | -(8)-S-(8)- | — | — | 1.82 | R-42 | 85number % | 290 nm | 2.30 |
| 414 | Present | (2) | -(8)-S-(8)- | — | — | 1.82 | R-42 | 85number % | 290 nm | 2.30 |
| 415 | Present | (6) | -(8)-S-(8)- | — | — | 1.83 | BT-HP9DX | 85number % | 300 nm | 2.42 |
| 416 | Present | (6) | -(8)-S-(8)- | Ti-A | — | 1.90 | BT-HP9DX | 85number % | 300 nm | 2.42 |
| 417 | Present | (1) | -(8)-S-(8)- | — | — | 1.80 | R-42 | 85number % | 290 nm | 2.30 |
| 418 | Present | (3) | -(8)-S-(8)- | — | — | 1.76 | R-42 | 85number % | 290 nm | 2.30 |
| 419 | Present | (4) | -(8)-S-(8)- | — | — | 1.83 | R-42 | 85number % | 290 nm | 2.30 |
| 420 | Present | (5) | -(8)-S-(8)- | — | — | 1.78 | R-42 | 85number % | 290 nm | 2.30 |
| 421 | Present | (7) | -(8)-S-(8)- | — | — | 1.79 | R-42 | 85number % | 290 nm | 2.30 |
| 422 | Present | (2) | -(8)-S(O)-(8)- | — | — | 1.81 | R-42 | 85number % | 290 nm | 2.30 |
| 423 | Present | (2) | (8)-S-(O)2-(8) | — | — | 1.80 | R-42 | 85number % | 290 nm | 2.30 |
| 424 | Present | (2) | -(8)-(8)- | — | — | 1.74 | R-42 | 85number % | 290 nm | 2.30 |
| 425 | Present | (2) | -(12)-(12)- | — | — | 1.84 | R-42 | 85number % | 290 nm | 2.30 |
| 426 | Present | (2) | -(9)-S-(8)- | — | — | 1.85 | R-42 | 85number % | 290 nm | 2.30 |
| 427 | Present | (2) | -(10)-S-(10)- | — | — | 1.86 | R-42 | 85number % | 290 nm | 2.30 |
| 428 | Present | (2) | -(11)-S-(11)- | — | — | 1.88 | R-42 | 85number % | 290 nm | 2.30 |
| 429 | Present | (2) | -(12)-S-(12)- | — | — | 1.89 | R-42 | 85number % | 290 nm | 2.30 |
| 430 | Present | (2) | -(8)-S-(8)- | Ti-A | — | 1.89 | R-42 | 85number % | 290 nm | 2.30 |
| 431 | Present | (2) | -(8)-S-(8)- | Ti-A | — | 1.89 | R-42 | 85number % | 300 nm | 1.64 |
| 432 | Present | (2) | -(8)-S-(8)- | Ti-A | — | 1.89 | SG-TO100 | 90number % | 100 nm | 2.40 |
| 433 | Present | (2) | -(8)-S-(8)- | Ti-A | — | 1.89 | MP-6035 | 100number % | 450 nm | 1.48 |
| 434 | Present | (2) | -(8)-S-(8)- | — | — | 1.82 | R-42 | 85number % | 290 nm | 2.30 |

| No. | Presence Rate[2] | Difference[3] | P/B | Thickness[4] | Efficiency[5] | Stability[6] | Note |
|---|---|---|---|---|---|---|---|
| 401 | — | — | — | — | 1.00 | 5 | Com. Example |
| 402 | 45% | 0.81 | 10 vol % | 500 nm | 1.10 | 1 | Com. Example |
| 403 | 60% | 0.81 | 10 vol % | 500 nm | 1.05 | 2 | Com. Example |
| 404 | 45% | 0.48 | 10 vol % | 300 nm | 1.45 | 5 | Invention |
| 405 | 60% | 0.48 | 20 vol % | 500 nm | 1.40 | 5 | Invention |
| 406 | 55% | 0.48 | 40 vol % | 500 nm | 1.35 | 5 | Invention |
| 407 | 50% | 0.48 | 50 vol % | 500 nm | 1.25 | 4 | Invention |
| 408 | 60% | 0.18 | 10 vol % | 500 nm | 1.20 | 5 | Invention |
| 409 | 65% | 0.58 | 10 vol % | 500 nm | 1.25 | 5 | Invention |
| 410 | 60% | 0.34 | 10 vol % | 750 nm | 1.35 | 5 | Invention |
| 411 | 60% | 0.48 | 10 vol % | 500 nm | 1.45 | 5 | Invention |
| 412 | 60% | 0.48 | 10 vol % | 500 nm | 1.45 | 5 | Invention |
| 413 | 60% | 0.48 | 10 vol % | 750 nm | 1.30 | 5 | Invention |
| 414 | 75% | 0.48 | 10 vol % | 1200 nm | 1.40 | 3 | Invention |
| 415 | 60% | 0.59 | 10 vol % | 500 nm | 1.45 | 5 | Invention |
| 416 | 70% | 0.52 | 10 vol % | 500 nm | 1.50 | 5 | Invention |
| 417 | 60% | 0.50 | 10 vol % | 500 nm | 1.35 | 5 | Invention |
| 418 | 60% | 0.54 | 10 vol % | 500 nm | 1.20 | 5 | Invention |
| 419 | 60% | 0.47 | 10 vol % | 500 nm | 1.45 | 5 | Invention |
| 420 | 60% | 0.52 | 10 vol % | 500 nm | 1.40 | 5 | Invention |
| 421 | 60% | 0.51 | 10 vol % | 500 nm | 1.45 | 5 | Invention |
| 422 | 60% | 1.49 | 10 vol % | 500 nm | 1.30 | 5 | Invention |
| 423 | 60% | 0.50 | 10 vol % | 500 nm | 1.30 | 5 | Invention |
| 424 | 60% | 0.56 | 10 vol % | 500 nm | 1.10 | 2 | Com. Example |
| 425 | 60% | 0.46 | 10 vol % | 500 nm | 1.40 | 5 | Invention |
| 426 | 60% | 0.45 | 10 vol % | 500 nm | 1.45 | 5 | Invention |
| 427 | 60% | 0.44 | 10 vol % | 500 nm | 1.45 | 5 | Invention |
| 428 | 60% | 0.42 | 10 vol % | 500 nm | 1.50 | 5 | Invention |
| 429 | 60% | 0.41 | 10 vol % | 500 nm | 1.50 | 4 | Invention |
| 430 | 65% | 0.41 | 10 vol % | 500 nm | 1.50 | 4 | Invention |
| 431 | 65% | 0.25 | 10 vol % | 500 nm | 1.30 | 5 | Invention |
| 432 | 65% | 0.51 | 10 vol % | 500 nm | 1.35 | 5 | Invention |

TABLE 5-continued

| | | | | | | | |
|---|---|---|---|---|---|---|---|
| 433 | 65% | 0.41 | 10 vol % | 750 nm | 1.45 | 5 | Invention |
| 434 | 70% | 0.48 | 5 vol % | 800 nm | 1.50 | 4 | Invention |

[1] Ratio of Aspect Rate of 2 or less;
[2] Particle Presence Rate at Substrate Side;
[3] Difference in Refractive Indexes;
[4] Thickness of Optical Scattering Layer;
[5] Luminescence Efficiency
[6] 85° C. Storage Stability;
Com.Example: Comparative Example As shown in Table 5, samples Nos. 404~423 and 425~434 that satisfied the requirements of the present invention were excellent in all of the evaluation results.

By contrast, sample No. 401 included no IES, resulting in poor in the luminescence efficiency. Further, samples Nos. 402 and 403 contained no resin component represented by the structure of X—Y—X', resulting in poor in the luminescence efficiency and long-term storage stability. Moreover, sample No. 424 did not contain S in the Y composition, resulting in poor in the luminescence efficiency and long-term storage stability.

DESCRIPTION OF REFERENCE NUMBERS

10 Transparent Conductive Member
11 Resin Substrate
12 Optical Scattering Layer
13 Particle
14 Binder
15 Transparent Conductive Film
20 Organic EL Element
21 Luminescence Layer Unit
22 Second Electrode
30 Organic Photovoltaic Cell
31 Functional Layer
32 Transparent Substrate
33 Transparent Electrode
34 Hole Transport Layer
35 Organic Power Generation Layer
36 Electron Transport layer
37 Electrode

The invention claimed is:

1. An electronic device comprising at least a functional layer on a resin substrate, wherein
the functional layer contains a component with a structure of X—Y—X';
X and X' independently have any one of structures represented at least the following formulae (1)~(7), respectively;

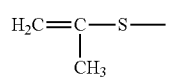 (1)

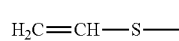 (2)

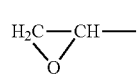 (3)

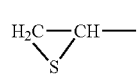 (4)

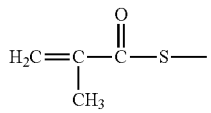 (5)

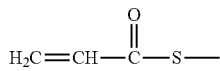 (6)

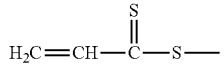 (7)

Y is a bivalent group comprising at least one S atom and one aromatic ring,

Y comprises any one of structures represented by —R—R'—, —R—S—R'—, and —R—S(O)—R'—, R and R' independently have any one of structures represented by the following formulae (8)~(12), respectively,

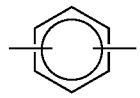 (8)

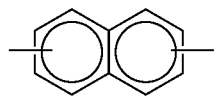 (9)

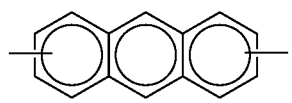 (10)

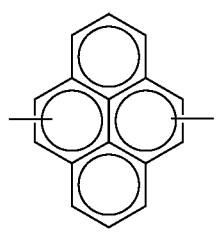 (11)

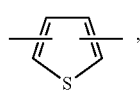 (12)

and when Y is represented by —R—R'—, at least one of R and R' is represented by the formula (12).

2. An organic electroluminescence element, wherein the electronic device according to claim 1 is an organic electroluminescence element.

3. The organic electroluminescence element according to claim 2, wherein an optical scattering layer is a layer comprising the functional layer containing particles and a binder.

4. The organic electroluminescence element according to claim 3, wherein the optical scattering layer comprises spherical particles at a rate in 80% or more of a number of particles with an aspect rate of 2 or less as the particles.

5. The organic electroluminescence element according to claim 4, wherein a mean particle diameter of the spherical particles is in the range from 200 nm to 500 nm.

6. The organic electroluminescence element according to claim 3, wherein the optical scattering layer has a thickness larger than a mean particle diameter of the particles in the optical scattering layer, and a particle presence volume rate of the particles located in a region at a side of the resin substrate relative to a center in a thickness direction is larger than a particle presence volume rate of the particles located in a region at a side of a transparent conductive film thus formed on the optical scattering layer relative to a center in a thickness direction.

7. The organic electroluminescence element according to claim 3, wherein a volume rate of the particles in the optical scattering layer is in the range from 1 volume % to 40 volume %.

8. The organic electroluminescence element according to claim 3, wherein a difference in refractive indexes between the particle and the binder is in the range from 0.20 to 1.00.

9. The organic electroluminescence element according to claim 3, wherein the optical scattering layer has a thickness in the range from 250 nm to 1000 nm.

\* \* \* \* \*